(12) United States Patent
Louwet et al.

(10) Patent No.: US 7,989,032 B2
(45) Date of Patent: Aug. 2, 2011

(54) UV-PHOTOPOLYMERIZABLE COMPOSITION FOR PRODUCING ORGANIC CONDUCTIVE LAYERS, PATTERNS OR PRINTS

(75) Inventors: Frank Louwet, Diepenbeek (BE); Louis Bollens, Begijnendijk (BE)

(73) Assignee: Agfa Gevaert, Mortsel (BE)

(*) Notice: Subject to any disclaimer, the term of this patent is extended or adjusted under 35 U.S.C. 154(b) by 896 days.

(21) Appl. No.: 11/836,581

(22) Filed: Aug. 9, 2007

(65) Prior Publication Data

US 2008/0050534 A1 Feb. 28, 2008

Related U.S. Application Data

(60) Provisional application No. 60/841,004, filed on Aug. 30, 2006.

(30) Foreign Application Priority Data

Aug. 21, 2006 (EP) ...................................... 6119230

(51) Int. Cl.
*G03F 7/00* (2006.01)
(52) U.S. Cl. ..................... 427/510; 427/511; 430/281.1; 522/79; 522/85
(58) Field of Classification Search .................. 522/79, 522/80, 141, 142, 120, 121, 85; 427/510, 427/511; 430/281.1
See application file for complete search history.

(56) References Cited

U.S. PATENT DOCUMENTS

| | | | | |
|---|---|---|---|---|
| 5,137,799 A * | 8/1992 | Kaempf et al. | ............. | 430/270.1 |
| 5,372,924 A | 12/1994 | Quintens et al. | | |
| 5,759,637 A * | 6/1998 | Angelopoulos et al. | ....... | 427/504 |
| 6,004,483 A * | 12/1999 | Jonas et al. | .................... | 252/500 |
| 6,099,757 A | 8/2000 | Kulkarni | | |
| 6,193,909 B1 | 2/2001 | Angelopoulos et al. | | |
| 6,399,375 B2 | 6/2002 | Vajta | | |
| 6,893,790 B2 * | 5/2005 | Lelental et al. | ............... | 430/138 |
| 6,994,026 B2 * | 2/2006 | De Voeght et al. | ......... | 101/401.1 |
| 7,842,196 B2 * | 11/2010 | Yoshida et al. | ............... | 252/500 |
| 2003/0006401 A1 * | 1/2003 | Haghighat et al. | ............. | 252/500 |
| 2003/0215517 A1 | 11/2003 | Grawe et al. | | |
| 2006/0008742 A1 | 1/2006 | Itoh et al. | | |
| 2006/0062958 A1 | 3/2006 | Yoshida et al. | | |

FOREIGN PATENT DOCUMENTS

| | | |
|---|---|---|
| DE | 3706355 A1 | 9/1988 |
| EP | 0 440 957 A2 | 8/1991 |
| EP | 0 686 662 A2 | 12/1995 |
| EP | 0 752 454 A2 | 1/1997 |
| EP | 1 003 179 A1 | 5/2000 |
| JP | 11-172103 A | 6/1999 |
| JP | 2005-170996 A | 6/2005 |
| WO | WO 01/20691 A1 | 3/2001 |
| WO | WO 02/06898 A | 1/2002 |
| WO | WO 02/067273 A1 | 8/2002 |
| WO | WO 02/072660 A1 | 9/2002 |
| WO | WO 02/072714 A1 | 9/2002 |
| WO | WO 03/001537 A1 | 1/2003 |
| WO | WO 03/048227 A1 | 6/2003 |
| WO | WO 03/048228 A1 | 6/2003 |
| WO | WO 03/048229 A1 | 6/2003 |
| WO | WO 2005/027145 A1 | 3/2005 |
| WO | WO 2006/080639 A1 | 8/2006 |
| WO | WO 2007/061559 A2 | 5/2007 |

OTHER PUBLICATIONS

Kim et al., "UV Cured Transparent Films Including Non-aqueous Conductive Microgels," *Polymers for Advanced Technologies*, 13 (7): 522-526 (2002).
European Patent Office, European Search Report of EP 06 11 9230 (Jul. 26, 2007).
L. Groenendaal et al., Advanced Materials, vol. 12, pp. 481-494 (2000).
P. Schottland et al., Synthetic Metals, vol. 101, pp. 7-8 (1999).
Handbook of Oligo and Polythiophenes, edited by D. Fichou, Wiley-VCH, Weinheim (1999), pp. 1-523.
L.J. Kloeppner et al., Am. Chem. Soc'y; Polymer Preprints, vol. 40(2), p. 792 (1999).
D.M. Welsh et al., Am. Chem. Soc'y; Polymer Preprints, vol. 38(2), p. 320 (1997).

* cited by examiner

*Primary Examiner* — Susan W Berman
(74) *Attorney, Agent, or Firm* — Leydig, Voit & Mayer, Ltd.

(57) ABSTRACT

A composition comprising a polyanion and a polymer or copolymer of a substituted or unsubstituted thiophene as a solution or as a dispersion in a liquid medium and at least one compound with at least two vinyl groups, wherein said liquid medium comprises at least one non-aqueous solvent and has less than 30% by weight of water; and said composition comprises more than 0.1% by weight of the polymer or copolymer of a substituted or unsubstituted thiophene and is capable of UV-photopolymerization due to said composition comprising at least one vinyl-compound capable of initiating UV-photopolymerization and/or at least one UV-photoinitiator; an ink with the composition of the composition; a process for preparing the composition; a process for producing a layer or pattern on an object with the composition; and a layer, pattern or print produced therewith.

14 Claims, No Drawings

UV-PHOTOPOLYMERIZABLE COMPOSITION FOR PRODUCING ORGANIC CONDUCTIVE LAYERS, PATTERNS OR PRINTS

CROSS-REFERENCE TO RELATED PATENT APPLICATIONS

This application claims the benefit of U.S. Provisional Application No. 60/841,004 filed Aug. 30, 2006, which is incorporated by reference. In addition, this application claims the benefit of European Application No. 06119230.8 filed Aug. 21, 2006, which is also incorporated by reference

FIELD OF THE INVENTION

The present invention relates to a UV-photopolymerizable composition for producing organic conductive layers, patterns or prints.

BACKGROUND OF THE INVENTION

U.S. Pat. No. 5,372,924 discloses an antistatic element comprising: a plastic support having a surface; a first layer on the surface of said plastic support, said first layer being polythiophene made up of units of the formula

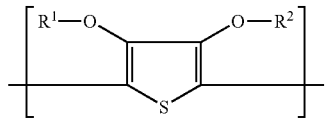

in which $R^1$ and $R^2$ independently of one another represent hydrogen or a $C_{1-4}$ alkyl group or, together form an optionally substituted $C_{1-4}$ alkylene radical, preferably an optionally alkyl-substituted methylene radical, an optionally $C_{1-12}$ alkyl- or phenyl-substituted 1,2-ethylene radical, a 1,3-propylene radical or a 1,2-cyclohexylene radical and $An^-$ is a polyanion; and a second layer, said second layer being a prepolymer which is curable by exposure to ionizing radiation.

U.S. Pat. No. 6,004,483 discloses a mixture of a polythiophene preparation which contains a polythiophene salt polythiophene$^+$ An$^-$ in which the polythiophene$^+$ of the polythiophene salt contains positively charged and uncharged recurring units of the formula

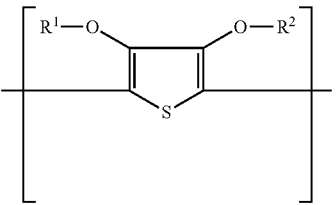

in which $R^1$ and $R^2$ independently of one another stand for hydrogen or a $C_1$-$C_4$ alkyl group or together form an optionally substituted $C_1$-$C_4$ alkylene radical, and $An^-$ denotes a polyanion, and a coating composition which contains a (meth)acryloyl group-containing prepolymer which contains per molecule at least two (meth)acryloyl groups and which is curable by ionizing radiation. U.S. Pat. No. 6,004,483 further discloses that examples of suitable radiation-curable coating compositions are (meth)acryloyl group-containing prepolymers which contain per molecule at least two (meth)acryloyl groups, preferably from two to four (meth)acryloyl groups, and which derive from polyesters, polyethers, polyepoxide compounds, aliphatic polyols, polyurethanes and vinyl polymers. U.S. Pat. No. 6,004,483 also discloses that preferred (meth)acrylate prepolymers are polyester (meth)acrylates such as are obtained by azeotropic esterification of dicarboxylic acids with di- or higher-functional polyols and (meth) acrylic acid and that amine-modified polyether acrylates, such as are obtained according to DE-OS 3 706 355 from aliphatic primary amines and (meth)acrylic acid esters of ethoxylated or propoxylated polyols, may furthermore be utilized as prepolymers which contain (meth)acryloyl groups. Furthermore, U.S. Pat. No. 6,004,483 discloses invention examples in which poly(3,4-ethylenedioxythiophene)-containing layers coated from an aqueous medium are UV-cured.

U.S. Pat. No. 6,099,757 discloses a composition comprising: a) from about 80 to 99.5 percent by weight of a functionalized film-forming polymer matrix; and b) from about 0.5 to 20 percent by weight of an intrinsically conductive polymer dispersed in said matrix; wherein the functionalized film-forming matrix controls the electrical conductivity in said composition within a range of less than 5 orders of magnitude from about $10^5$ to about $10^{10}$ ohm/square and is selected from the group consisting of acrylates and methacrylates containing at least one functionality selected from the group consisting of urethane, epoxy, glycol, hydroxyl, polyester, ethoxylates and propoxylates. U.S. Pat. No. 6,099,757 further discloses that the intrinsically conductive polymer may be selected from the group consisting of polyanilines, polythiophenes, polypyrroles, poly(phenylene vinylenes), poly (arylene vinylenes), poly(isothianaphthalenes), and substituted derivatives thereof and that composition may be curable with high energy radiation electron beams, X-rays, UV-radiation, microwave radiation, infrared radiation, corona discharge, gamma rays and heat. Furthermore, U.S. Pat. No. 6,099,757 discloses invention examples in which polyaniline-containing layers coated from a non-aqueous medium are UV-cured. U.S. Pat. No. 6,099,757 fails to disclose specific substituted polythiophenes.

U.S. Pat. No. 6,193,909 discloses a structure comprising: a composition comprising precursors to an electrically conductive polymer wherein said precursor comprises covalent crosslinks and solvent solvating enhancing functionality said crosslinkable functionality is selected from the group consisting of hydrogen bonding functionality and chemical crosslinkable functionality selected from the group consisting of hydroxyethyl and hydroxymethyl groups.

In 2002, Y-B Kim et al. in Polymers for Advanced Technologies, volume 13(7), pages 522-526, reported UV-cured transparent films containing conductive microgels coated with polyaminiline/dodecyl-benzenesulponic acid (DBSA).

JP 11-172103A discloses a composition obtained by compounding (A) a polyaniline derivative obtained by doping 1-10 mol. % of an aniline structure constituting the polyaniline with a sulfone-containing compound having an unsaturated double bond and (B) a photopolymerization initiator (e.g. benzoin or benzil), and preferably (C) an acrylate and/or methacrylate [e.g. diethylene glycol (meth)acrylate)], the sulfone group-containing compound having an unsaturated double bond being preferably 2-acrylamide-2-methylpropanesulfonic acid. Furthermore, JP 11-172103A discloses invention examples in which polyaniline-containing layers coated from a non-aqueous medium are UV-cured.

WO 02/06898A discloses a material for making an electroconductive pattern, said material comprising a support and a light-exposure differentiable element, characterized in that said light-exposure differentiable element comprises an outermost layer containing a polyanion and a polymer or copolymer of a substituted or unsubstituted thiophene, and optionally a second layer contiguous with said outermost layer; and wherein said outermost layer and/or said optional second layer contains a light-sensitive component capable upon exposure of changing the removability of the exposed parts of said outermost layer relative to the unexposed parts of said outermost layer. WO 02/069898A discloses invention examples in which poly(3,4-ethylenedioxy-thiophene)-containing layers coated from an aqueous medium are UV-crosslinked and electroconductive layers with surface resistances down to 480 Ω/square are reported, this surface resistance being realized in the absence of binder with a layer coated with the following composition:

| | |
|---|---|
| 1.2% aqueous dispersion of PEDOT/PSS = | 417 g |
| 0.25% aqueous solution of diazo resin No. 8 from FAIRMOUNT CHEMICAL = | 100 g |
| 2% aqueous solution of ZONYL ™ FSO 100 = | 10 g |
| N-methyl-pyrrolidinone = | 50 g |
| deionized water = | 423 g | upon exposure in a PRINTON™ CDL 1502i UV contact exposure unit (from AGFA-GEVAERT N.V.) for 30-75 s at 2 mW/cm$^2$ (=exposure of 0.06-0.15 J/cm$^2$).

WO 03/001537A discloses a material for making an electroconductive pattern, said material comprising a support and a light-exposure differentiable element, characterized in that said light-exposure differentiable element comprises a conductivity enhanced outermost layer containing a polyanion and a polymer or copolymer of a substituted or unsubstituted thiophene, and optionally a second layer contiguous with said outermost layer; and wherein said outermost layer and/or said optional second layer contains a monodiazonium salt capable upon exposure of reducing the conductivity of the exposed parts of said outermost layer relative to the unexposed parts of said outermost layer. WO 03/001537A discloses invention examples in which poly(3,4-ethylene-dioxythiophene)-containing layers coated from an aqueous medium are UV-crosslinked with monodiazo-compounds with resulting increase in surface resistance.

U.S. Pat. No. 6,399,675 discloses a method for preparing an electrically conductive microgel comprising, on the basis of the electrically conductive microgel, adding 3 to 30% weight % of a monomer for synthesizing an electrically conductive polymer and 1 to 20 weight % of a dopant to 15 to 80 weight % of an organic solution containing 5 to 60% weight % of microgel particles based on the organic solution; and polymerizing said monomer at a temperature of 0 to 80° C. with the addition of 2 to 40 weight % of an aqueous solution containing 1 to 40 weight % of an oxidative polymerization catalyst based on the aqueous solution in which the polymer is adsorbed on the surface of the microgel particles. U.S. Pat. No. 6,399,675 further discloses that for coating application, the electrically conductive microgel of the present invention may be combined with various binders, depending on the electrical conductivity and physical properties required for the coating, in association with a binder, the microgel can be maintained in a three dimensional structure when being dried (in the form of paint) e.g. polyurethane resins, polyacrylic resins, thermosetting alkyd resins, and radiation curing vinyl monomers or oligomers.

US 2006/0008742A1 discloses a process for producing an electroluminescent element, comprising repeating at least twice the step of forming an electroluminescent layer comprising a buffer layer and a luminescent layer by patterning using a photolitho-graphic process, thereby producing an electroluminescent element comprising a patterned electroluminescent layer, said process comprising the steps of: forming a first pattern part comprising a first buffer layer as the lowermost layer; and coating a solution for second buffer layer formation in a region including said first pattern part, said first buffer layer being immiscible with said solution for second buffer layer formation. US 2006/0008742A1 further discloses that the first buffer layer can be formed from a coating liquid for buffer layer formation, comprising at least a photocatalyst and a heat- and/or photo-curable binder, the first buffer layer being formed from a water soluble coating liquid for buffer layer formation, and a first luminescent layer being formed from a non-aqueous coating liquid for luminescent layer formation. Furthermore, US 2006/0008742A1 discloses that the water soluble coating liquid for buffer layer formation may contain an organic material, which can be poly-3,4-alkenedioxythiophene with polystyrenesulfonic acid, or a derivative thereof. No information concerning the electrical conductivity of such buffer layers is provided in US 2006/0008742A.

WO 2006/080639A1 discloses an electrically conductive and scratch-resistant UV-curable composition with conductivity and scratch resistance, which comprises 4-5.9% by weight of a polythiophene-based conductive polymer aqueous solution having 1.3% by weight of solids, 7-9.9% by weights of a UV-oligomer, 82-88% by weight of an organic solvent, 0.4-0.8% by weight of a photoinitiator, and 0.2-0.05% by weight of a scratch-resistant additive, wherein the organic solvent is at least one selected from the group consisting of n-propylalcohol, methyl cellosolve, propyleneglycolmethyl ether, and diacetonealcohol, wherein the photoinitiator is selected from the group consisting of α-hydroxycyclohexylphenyl-methanone, 1-hydroxycyclohexylmethylaceto-phenone, benzophenone and benzoin, and wherein the scratch-resistant additive is ethoxylated silicone and wherein when formed into a coating film, the UV-curable composition has a hardness of 4H or more, a surface resistance of less than 10$^7$ Ω/square and a visible light transmittance of more than 96%. 4 to 5.9% by weight of a polythiophene-based conductive polymer aqueous solution having 1.3% by weight of solids corresponds to a concentration of polythiophene in the UV-curable composition of <0.052 to <0.0767% by weight, since the concentration of 1.3% by weight corresponds to all solids not just polythiophene. WO 2006/080639A1 also discloses an electrically conductive and scratch-resistant UV-curable composition with conductivity and scratch resistance, which comprises 4-5.9% by weight of a polythiophene-based conductive polymer aqueous solution containing 1.3% by weight of solids doped with polystyrene sulfonate, 7-9.9% by weights of a mixture of U-DPPA and DPHA, 82-88% by weight of an organic solvent, 0.4-0.8% by weight of α-hydroxycyclohexylphenyl-methanone as a photoinitiator, and 0.2-0.05% by weight of ethoxylated silicone as a scratch-resistant additive, and when formed into a coating film, has a hardness of 4H or more, a surface resistance of less than 10$^7$ Ω/square and a visible light transmittance of more than 96%. 4 to 5.9% by weight of a polythiophene-based conductive polymer aqueous solution containing 1.3% by weight of solids doped with polystyrene sulfonate corresponds to a concentration of polythiophene in the UV-curable composition of <0.052 to <0.0767% by weight, since this weight includes polystyrene sulfonate.

WO 07/061,559A2 discloses an electrically conductive composition comprising a photopolymer and an electrically conductive polymer dissolved or dispersed in a solvent system, said electrically conductive polymer comprising thiophene monomers. The PEDOT/PSS dispersions used in the EXAMPLES were BAYTRON® P, a 1.2% by weight of PEDOT/PSS (1:2.46 by weight) in water and BAYTRON® P HS, a 4.0% by weight dispersion of PEDOT/PSS (1:2.46 by weight) in water with water concentrations in the compositions of greater than 40 wt % and PEDOT-concentrations of 0.08 to 0.2 wt %.

WO 02/067273A1 discloses a method for exchanging solvent in a mixture comprising water and an optionally substituted polythiophene, the method comprising: a) heating at least one solvent in a vessel under conditions suitable for vaporizing water; b) contacting the heated solvent with the mixture comprising water and optionally substituted polythiophene, the contact being sufficient to remove at least part of the water from the mixture as vapor; and c) exchanging the water removed from the mixture with the solvent.

WO 02/072660A1 discloses a process for preparing a dispersion or a solution containing an optionally substituted polythiophene in an organic solvent, comprising: a) adding a water-miscible organic solvent or a water-miscible solvent mixture to an aqueous dispersion or solution comprising optionally substituted polythiophenes; and b) removing at least some of the water from the mixture resulting from step a), and thereby forming the dispersion of the solution; and a dispersion or a solution comprising a polythiophene$^+$An$^-$ ion complex, wherein the polythiophene$^+$ is a polymer comprising recurring units of the formula (I):

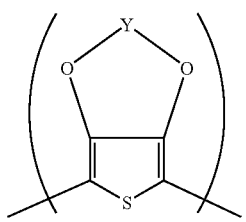

at least some of which are positively charged and wherein Y is —$(CH_2)_m$—$CR^1R^2(CH_2)_n$— or an optionally substituted 1,2-$C_3$-$C_8$-cycloalkylene radical, and $R^1$ and $R^2$, independently of one another, are hydrogen, hydroxymethyl, an optionally substituted $C_1$-$C_{20}$-alkyl radical or an optionally substituted $C_6$-$C_{14}$-aryl, and m and n are identical or different and are an integer from 0 to 3, and wherein An$^-$ is an anion of an organic polyacid, in a low-water-content or an anhydrous organic solvent.

WO 02/072714 discloses solutions and/or dispersions of organic semiconductors in a solvent mixture of at least two different organic solvents, characterized in that (A) each of the solvents on its own exhibits a boiling point below 200° C. and a melting point less than or equal to 15° C., (B) at least one of the solvents exhibits a boiling point between 140° C. and 200° C., (C) the solvents used do not contain benzylic $CH_2$- or CH-groups, (D) the solvents used are not benzene derivatives, which contain tertiary butyl substituents or more than two methyl substituents.

WO 03/048228A1 discloses a method for preparing a composition containing between 0.08 and 3.0% by weight of a polymer or copolymer of a 3,4-dialkoxythiophene in which said two alkoxy groups may be the same or different or together represent an optionally substituted oxy-alkylene-oxy bridge, a polyanion and at least one non-aqueous solvent, from a dispersion of said polymer or copolymer of (3,4-dialkoxythiophene) and said polyanion in water which is prepared in the substantial absence of oxygen, comprising in the following order the steps of: i) mixing at least one of said non-aqueous solvents with said aqueous dispersion of said polymer or copolymer of (3,4-dialkoxythiophene) and said polyanion; and ii) evaporating water from the mixture prepared in step i) until the content of water therein is reduced by at least 65% by weight.

WO 03/048229A1 discloses a method for preparing a composition containing between 0.08 and 3.0% by weight of a polymer or copolymer of a 3,4-dialkoxythiophene in which said two alkoxy groups may be the same or different or together represent a oxy-alkylene-oxy bridge optionally substituted with substituents selected from the group consisting of alkyl, alkoxy, alkyoxyalkyl, carboxy, alkylsulphonato, alkyloxyalkylsulphonato and carboxy ester groups, a polyanion and at least one polyhydroxy non-aqueous solvent from a dispersion of said polymer or copolymer of (3,4-dialkoxythiophene) and said polyanion in water comprising in the following order the steps of: i) mixing at least one of said non-aqueous solvents with said aqueous dispersion of said polymer or copolymer of (3,4-dialkoxythiophene) and said polyanion; and ii) evaporating water from the mixture prepared in step i) until the content of water therein is reduced by at least 65% by weight.

The prior art in respect to the UV-curing of polythiophene and substituted polythiophene-containing layers exclusively concerns layers coated from an aqueous medium i.e. a medium having at least 50% by weight of water. However, water evaporates from such screen printing inks resulting in clogging of the mesh and thicker conductive layers and prints produced with aqueous UV-curable inks with a polythiophene concentration greater than 0.1% by weight of polythiophene and/or substituted polythiophene exhibit poor quality prints with high haze.

ASPECTS OF THE INVENTION

It is therefore an aspect of the present invention to provide a UV-photopolymerizable composition for producing higher quality thicker conductive layers and prints with lower haze.

It is therefore a further aspect of the present invention to provide a UV-photopolymerizable composition for producing higher quality thicker electroconductive layers and prints with lower haze.

It is therefore a further aspect of the present invention to provide a UV-photopolymerizable ink for producing higher quality thicker conductive layers and prints with lower haze.

It is therefore a further aspect of the present invention to provide a UV-photopolymerizable ink for producing higher quality thicker electroconductive layers and prints with lower haze.

Further aspects and advantages of the invention will become apparent from the description hereinafter.

SUMMARY OF THE INVENTION

It has been surprisingly found that a UV-photopolymerizable composition comprising more than 0.1% by weight of polythiophene and/or a substituted polythiophene coated or printed from media with less than 30% by weight of water exhibit good quality electroconductive layers and prints with low haze and good conductivity.

Aspects of the present invention are realized by a composition comprising a polyanion and a polymer or copolymer of a substituted or unsubstituted thiophene as a solution or as a dispersion in a liquid medium and at least one compound with at least two vinyl groups, wherein said liquid medium comprises at least one non-aqueous solvent and has less than 30% by weight of water; and said composition comprises more than 0.1% by weight of the polymer or copolymer of a substituted or unsubstituted thiophene and is capable of UV-photopolymerization due to said composition comprising at least one vinyl-compound capable of initiating UV-photopolymerization and/or at least one UV-photoinitiator. This composition may be an ink or paste.

Aspects of the present invention are realized by a process for preparing the above-mentioned composition, the preparation process comprising the steps of: providing a dispersion or solution of a polyanion and a polymer or copolymer of a substituted or unsubstituted thiophene in a polyhydroxy-solvent-containing liquid medium comprising at least 70% by weight of organic solvents, the balance being water; and adding at least one photoinitiator and at least one monomer; and mixing the resulting mixture.

Aspects of the present invention are also realized by a process for producing a layer or pattern on an object comprising the steps of: (i) applying to said object a layer or pattern with a composition comprising a polyanion and a polymer or copolymer of a substituted or unsubstituted thiophene as a solution or as a dispersion in a liquid medium and at least one compound with at least two vinyl groups, wherein said liquid medium comprises at least one non-aqueous solvent and has less than 30% by weight of water; and said composition comprises more than 0.1% by weight of the polymer or copolymer of a substituted or unsubstituted thiophene and is capable of UV-photopolymerization due to said composition comprising at least one vinyl-compound capable of initiating UV-photopolymer-ization and/or at least one UV-photoinitiator; (ii) optionally drying said layer or pattern; (iii) optionally heating said layer or pattern to reduce the surface resistance thereof; and (iii) curing said layer or pattern by exposing to UV-light.

Aspects of the present invention are also realized by a layer or pattern obtainable by the above-mentioned process for producing a layer or pattern on an object.

Aspects of the present invention are realized by a print obtainable by the above-mentioned process for producing a layer or pattern on an object.

Preferred embodiments are disclosed in the dependent claims.

DETAILED DESCRIPTION OF THE INVENTION

Definitions

The term alkoxy means all variants possible for each number of carbon atoms in the alkoxy group i.e. for three carbon atoms: n-propyl and isopropyl; for four carbon atoms: n-butyl, isobutyl and tertiary-butyl; for five carbon atoms: n-pentyl, 1,1-dimethylpropyl, 2,2-dimethylpropyl and 2-methylbutyl etc.

The term oxyalkylenealkoxy means two oxygen atoms linked by an alkylene group. An alkylene group is a substituted or unsubstituted hydrocarbon group e.g. a —$(CH_2)_n$— group where n is an integer between 1 and 4, which may be substituted with an alkoxy, aryloxy, alkyl, aryl, alkaryl, alkyloxyalkyl, alkyloxyalkaryl, alkyloxyaryl, hydroxy, carboxy, carboxyalkyl, carboxyamino, sulfo or alkylsulfo group.

The term derivatives as used in connection with a particular polymer refers to variants thereof substituted with alkyl, alkoxy, alkyloxyalkyl, carboxy, alkylsulfonato and carboxy ester groups.

The term UV-photoinitiator, as used in disclosing the present invention, means a non-vinyl compound capable upon exposure to light with a wavelength in the range 200 to 400 nm of initiating the polymerization of compounds containing at least one vinyl group.

The term UV-curable compound with at least two vinyl groups, as used in disclosing the present invention, is a compound capable upon exposure to light with a wavelength in the range 200 to 400 nm of undergoing photopolymerization.

The term liquid medium, as used in disclosing the present invention, means a liquid medium excluding the at least one compound with at least two vinyl groups and the optional at least one photoinitiator.

The term transparent as used in disclosing the present invention means having the property of transmitting at least 70% of the visible incident light without diffusing it.

The term translucent as used in disclosing the present invention means allowing the passage of light, yet diffusing it so as not to render bodies lying beyond clearly visible.

The term electroconductive means having a surface resistivity below $10^6$ Ω/square. Antistatic materials have surface resistivities in the range from $10^6$ to $10^{11}$ Ω/square and cannot be used as an electrode.

The term electroconductive pattern means a pattern made up by the non-removed areas of the outermost layer, according to the present invention, which are electroconductive or can be made electroconductive by post-treatment.

The term conductivity enhancement, i.e. surface resistance reduction, refers to a process in which the conductivity is enhanced e.g. by contact with high boiling point liquids such as di- or polyhydroxy- and/or carboxy groups or amide or lactam group comprising organic compound optionally followed by heating at elevated temperature, preferably between 100 and 250° C., during preferably 1 to 90 seconds, results in conductivity increase. Alternatively in the case of aprotic compounds with a dielectric constant $\geq 15$, e.g. N-methyl-pyrrolidinone, temperatures below 100° C. can be used. Such conductivity enhancement is observed with polythiophenes and can take place during the preparation of the outermost layer or subsequently. Particularly preferred liquids for such treatment are N-methyl-pyrrolidinone and diethylene glycol such as disclosed in EP-A 686 662 and EP-A 1 003 179.

The term "support" means a "self-supporting material" so as to distinguish it from a "layer" which may be coated on a support, but which is itself not self-supporting. It also includes any treatment necessary for, or layer applied to aid, adhesion to the light-exposure differentiable element.

The term flexible as used in disclosing the present invention means capable of following the curvature of a curved object such as a drum e.g. without being damaged.

PEDOT as used in the present disclosure stands for poly (3,4-ethylenedioxythiophene).

PSS as used in the present disclosure stands for poly(styrene sulfonic acid) or poly(styrene sulfonate).

Composition

Aspects of the present invention are realized by a composition comprising a polyanion and a polymer or copolymer of a substituted or unsubstituted thiophene as a solution or as a dispersion in a liquid medium and at least one compound with at least two vinyl groups, wherein said liquid medium comprises at least one non-aqueous solvent and has less than 30% by weight of water; and said composition comprises more than 0.1% by weight of the polymer or copolymer of a substituted or unsubstituted thiophene and is capable of UV-photo-polymerization due to said composition comprising at least one vinyl-compound capable of initiating UV-photopolymerization and/or at least one UV-photoinitiator.

According to a first embodiment of the composition, according to the present invention, the composition further comprises at least one compound with one vinyl group, which is capable of copolymerizing with said at least one compound with at least two vinyl groups.

Suitable compounds with one vinyl group include:

| Monomer nr | Product Code | description | Mn |
|---|---|---|---|
| 1 | SR256# | 2-(2-ethoxy-ethoxy)-ethyl acrylate (EOEOEA) | 188 |
| 2 | Plex 68520* | 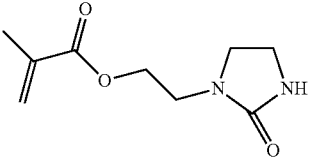 N-(2-methacryloyl-oxyethyl)-ethylene urea | 198 |
| 3 | SR285# | tetrahydrofurfuryl acrylate (THFA) | 156 |
| 4 | CD550# | methoxy PEG 350 monomethacrylate | 494 |
| 5 | SR604# | polypropylene glycol monomethacrylate | 405 | from Sartomer division of Cray Valley
*from Degussa

According to a second embodiment of the composition, according to the present invention, the at least one vinyl-compound capable of initiating UV-photopolymerization has at least two vinyl groups.

According to a third embodiment of the composition, according to the present invention, the composition is an ink or paste.

According to a fourth embodiment of the composition, according to the present invention, the composition has a viscosity at the coating temperature of 5 to 200 Pas at a shear rate of 0.1 s$^{-1}$. For screen printing applications the composition is preferably shear thinning with viscosities at the coating temperature at 100 s$^{-1}$ in the range of 0.2 to 5 Pas i.e. the composition is non-Newtonian and is strongly thixotropic.

According to a fifth embodiment of the composition, according to the present invention, the composition comprises more than 0.15% by weight of the polymer or copolymer of a substituted or unsubstituted thiophene.

According to a sixth embodiment of the composition, according to the present invention, the composition comprises more than 0.2% by weight of the polymer or copolymer of a substituted or unsubstituted thiophene.

According to a seventh embodiment of the composition, according to the present invention, the composition comprises not more than 15% by weight of the polymer or copolymer of a substituted or unsubstituted thiophene, preferably not more than 10% by weight of the polymer or copolymer of a substituted or unsubstituted thiophene and particularly preferably not more than 5% by weight of the polymer or copolymer of a substituted or unsubstituted thiophene.

According to an eighth embodiment of the composition, according to the present invention, the composition is capable upon coating and drying of realizing a surface resistance of less than 5000 Ω/square at an optical density in the visible range of the spectrum of 0.08, preferably capable of realizing a surface resistance of less than 2000 Ω/square at an optical density in the visible range of the spectrum of 0.08 and particularly preferably capable of realizing a surface resistance of less than 1000 Ω/square at an optical density in the visible range of the spectrum of 0.08.

Suitable compositions can also incorporate binders, thickeners, fillers, pigments and dyes, anti-foaming agents and surfactants.

Non-transparent compositions can, for example, be realized by incorporating a pigment such as LEVACRYL® A-SF, a black pigment from BAYER, into the above-mentioned paste, used for producing transparent electrodes, in a weight sufficient to give non-transparency in the layer thickness being coated. Other suitable black pigments are KL1925, a carbon black dispersion from DEGUSSA, and MHI Black 8102M, a carbon black dispersion from MIKUNI, and titanium dioxide pigments.

Transparent coloured compositions can be realized by incorporating coloured dyes or pigments e.g. Rhodamine 6G, copper phthalocyanine and phthalocyanine pigments such as Flexonyl® Blau BZG, a blue-green pigment from BAYER.

Suitable anti-foaming agents are ethanol and the silicone antifoam agent X50860A from Shin-Etsu.

Preferred surfactants are anionic and non-ionic surfactants with non-ionic surfactants being particularly preferred. Preferred non-ionic surfactants are selected from the group of surfactants consisting of ethoxylated/fluororalkyl surfactants, polyethoxylated silicone surfactants, polysiloxane/polyether surfactants, polysiloxane/polyester surfactants, polysiloxane surfactants, substituted acetylene surfactants, fumed silica, alkylphenyl-polyether surfactants, alkylpolyether surfactants, alkylpolyglucoside surfactants, polyethoxylated surfactants and fluorine-containing non-ionic surfactants, with polysiloxane surfactants, polysiloxane-polyether surfactants and alkylphenyl-polyether surfactants being particularly preferred.

Suitable non-ionic surfactants are:

Surfactant no. 01=ZONYL® FSN, a 40% by weight solution of $F(CF_2CF_2)_{1-9}CH_2CH_2O(CH_2CH_2O)_xH$ in a 50% by weight solution of isopropanol in water where x=0 to about 25, from DuPont;

Surfactant no. 02=ZONYL® FSN 100: $F(CF_2CF_2)_{1-9}CH_2CH_2O(CH_2CH_2O)_xH$ where x=0 to about 25, from DuPont;

Surfactant no. 03=ZONYL® FS300, a 40% by weight aqueous solution of a fluorinated surfactant, from DuPont;

Surfactant no. 04=ZONYL® FSO, a 50% by weight solution of $F(CF_2CF_2)_{1-7}CH_2CH_2O(CH_2CH_2O)_yH$ where y=0 to ca. 15 in a 50% by wt. solution of ethylene glycol in water, from DuPont;

Surfactant no. 05=ZONYL® FSO 100, a mixture of ethoxylated non-ionic fluoro-surfactant with the formula: $F(CF_2CF_2)_{1-7}CH_2CH_2O(CH_2CH_2O)_yH$ where y=0 to ca. 15, from DuPont;

Surfactant no. 06=TEGOGLIDE® 410, a polysiloxane-polyether copolymer surfactant, from Goldschmidt;

Surfactant no. 07=TEGO FLOW® ATF from Goldschmidt;

Surfactant no. 08=TEGOGLIDE® ZG400, a polysiloxane-polyether copolymer surfactant from Goldschmidt;

Surfactant no. 09=TEGOWET®, a polysiloxane-polyester copolymer surfactant, from Goldschmidt;

Surfactant no. 10=TEGOWET® 260, a ethyleneglycol-B-propyleneglycol-B-siloxanesiloxane block copolymer surfactant, from Goldschmidt;
Surfactant no. 11=FLUORAD® FC431: $CF_3(CF_2)_7SO_2(C_2H_5)N—CH_2CO—(OCH_2CH_2)_nOH$ from 3M;
Surfactant no. 12=FLUORAD® FC126, a mixture of the ammonium salts of perfluorocarboxylic acids, from 3M;
Surfactant no. 13=Polyoxyethylene-10-lauryl ether
Surfactant no. 14=Baysilone Paint Additive MA, a silicone oil from Bayer
Surfactant no. 15=BYK® 307, a polysiloxane-polyether surfactant from BYK Chemie;
Surfactant no. 16=BYK® 310, a polyester dimethylsiloxane surfactant from BYK Chemie;
Surfactant no. 17=SURFYNOL® 465, an alkyl-polyether-acetylene surfactant from Air Products;
Surfactant no. 18=SURFYNOL® 104PG50, 2,4,7,9-tetramethyl-5-decyne-4,7-diol in propyleneglycol from Air Products;
Surfactant no. 19=SURFYNOL® 420, an alkyl-polyether-acetylene surfactant from Air Products;
Surfactant no. 20=SURFYNOL® 485, an alkyl-polyether-acetylene surfactant from Air Products;
Surfactant no. 21=SURFYNOL® DF75, 2% fumed silica from Air Products;
Surfactant no. 22=OLIN 10G, a nonylphenyl-polyether surfactant from OLIN Corporation;
Surfactant no. 23=EMULGEN® 109P, a dodecylpolyether surfactant from KAO Corporation;
Surfactant no. 24=SILWET® L7607, a polysiloxane-polyether surfactant from OSI Specialities Benelux;
Surfactant no. 25=SILWET® L7602, a polysiloxane-polyether surfactant from OSI Specialities Benelux;
Surfactant no. 26=SILWET® L77, a polysiloxane-polyether surfactant from OSI Specialities Benelux;
Surfactant no. 27=SYNPERONIC® A7, a mixture of alkylpolyethers from UNIQUEMA;
Surfactant no. 28=SD131G1, a hydroxyalkylsorbitol glucoside surfactant from CESALPINA CHEMICALS SPA
Surfactant no. 29=GLUCOPON® 650EC, a mixture of $C_8$-$C_{14}$ fatty acid polyglucosides from HENKEL;
A particularly preferred non-ionic surfactant is ZONYL® FSO 100.

Preferred anionic surfactants are selected from the group of surfactants consisting of fluorosurfactants substituted with sulpho, carboxy or phosphoric acid groups as ammonium, alkali ion or free acids, block copolymers of tetrafluoroethylene-B-alkyleneoxide-B-copolymers substituted with sulpho, carboxy or phosphoric acid groups as ammonium, alkali ion or free acids, perfluoro-alkylcarboxylic acids and alkali or ammonium salts of perfluoro-alkylcarboxylic acids.

Suitable anionic surfactants are:
Surfactant no. 30=ZONYL® 7950, a fluorinated surfactant, from DuPont;
Surfactant no. 31=ZONYL® FSA, 25% by weight solution of $F(CF_2CF_2)_{1-9}CH_2CH_2SCH_2CH_2COOLi$ in a 50% by weight solution of isopropanol in water, from DuPont;
Surfactant no. 32=ZONYL® FSE, a 14% by weight solution of $[F(CF_2CF_2)_{1-7}CH_2CH_2O]_xP(O)(ONH_4)_y$ where x=1 or 2; y=2 or 1; and x+y=3 in a 70% by wt solution of ethylene glycol in water, from DuPont;
Surfactant no. 33=ZONYL® FSJ, a 40% by weight solution of a blend of $F(CF_2CF_2)_{1-7}CH_2CH_2O]_xP(O)(ONH_4)_y$ where x=1 or 2; y=2 or 1; and x+y=3 with a hydrocarbon surfactant in 25% by weight solution of isopropanol in water, from DuPont;
Surfactant no. 34=ZONYL® FSP, a 35% by weight solution of $[F(CF_2CF_2)_{1-7}CH_2CH_2O]_xP(O)(ONH_4)_y$ where x=1 or 2; y=2 or 1 and x+y=3 in 69.2% by weight solution of isopropanol in water, from DuPont;
Surfactant no. 35=ZONYL® UR: $[F(CF_2CF_2)_{1-7}CH_2CH_2O]_x P(O)(OH)_y$ where x=1 or 2; y=2 or 1 and x+y=3, from DuPont;
Surfactant no. 36=ZONYL® TBS: a 33% by weight solution of $F(CF_2CF_2)_{3-8}CH_2CH_2SO_3H$ in a 4.5% by weight solution of acetic acid in water, from DuPont;
Surfactant no. 37=Ammonium salt of perfluoro-octanoic acid.

Polymer or Copolymer of a (3,4-Dialkoxythiophene)

Aspects of the present invention are realized by a composition comprising a polyanion and a polymer or copolymer of a substituted or unsubstituted thiophene as a solution or as a dispersion in a liquid medium and at least one compound with at least two vinyl groups, wherein said liquid medium comprises at least one non-aqueous solvent and has less than 30% by weight of water; and said composition comprises more than 0.1% by weight of the polymer or copolymer of a substituted or unsubstituted thiophene and is capable of UV-photopolymerization due to said composition comprising at least one vinyl-compound capable of initiating UV-photopolymerization and/or at least one UV-photoinitiator.

According to a ninth embodiment of the composition, according to the present invention, the polymer or copolymer of a substituted thiophene is a polymer or copolymer of a 3,4-dialkoxythiophene in which said two alkoxy groups may be the same or different or together represent an optionally substituted oxy-alkylene-oxy bridge.

According to a tenth embodiment of the composition, according to the present invention, the 3,4-dialkoxythiophene has the formula

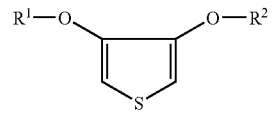

in which, each of $R^1$ and $R^2$ independently represents hydrogen or a C1-4 alkyl group or together represent an optionally substituted C1-4 alkylene group or a cycloalkylene group. Preferably $R^1$ and $R^2$ together represent an oxy-alkylene-oxy bridge substituted with alkyl, alkoxy, alkyloxyalkyl, carboxy, alkylsulfonato and carboxy ester groups.

According to an eleventh embodiment of the composition, according to the present invention, the polymer or copolymer of a (3,4-dialkoxythiophene) is selected from the group consisting of: poly(3,4-methylenedioxythiophene), poly(3,4-methylenedioxy-thiophene) derivatives, poly(3,4-ethylenedioxythiophene), poly(3,4-ethylenedioxythiophene) derivatives, poly[3,4-(propylenedioxy)-thiophene], poly[3,4-(propylenedioxy)thiophene] derivatives, poly(3,4-butylenedioxythiophene), poly(3,4-butylenedioxythiophene) derivatives and copolymers therewith.

According to a twelfth embodiment of the composition, according to the present invention, the polymer of a substituted thiophene is a poly(3,4-dialkoxy-thiophene) in which the two alkoxy groups together represent an optionally substituted oxy-alkylene-oxy bridge which is a 1,2-ethylene group, an optionally alkyl-substituted methylene group, an optionally C1-12 alkyl- or phenyl-substituted 1,2-ethylene group, a 1,3-propylene group or a 1,2-cyclohexylene group.

Such polymers are disclosed in Handbook of Oligo- and Polythiophenes Edited by D. Fichou, Wiley-VCH, Weinheim (1999); by L. Groenendaal et al. in Advanced Materials, volume 12, pages 481-494 (2000); L. J. Kloeppner et al. in Polymer Preprints, volume 40(2), page 792 (1999); P. Schottland et al. in Synthetic Metals, volume 101, pages 7-8 (1999); and D. M. Welsh et al. in Polymer Preprints, volume 38(2), page 320 (1997).

Polyanion Compound

The polyanion compounds for use in the first and second conductive electrodes of the electroluminescent device of the present invention are disclosed in EP-A 440 957 and include polymeric carboxylic acids, e.g. polyacrylic acids, polymethacrylic acids, or polymaleic acids and polysulphonic acids, e.g. poly(styrene sulphonic acid). These polycarboxylic acids and polysulphonic acids can also be copolymers of vinylcarboxylic acids and vinylsulphonic acids with other polymerizable monomers, e.g. acrylic acid esters, methacrylic acid esters and styrene. A particularly preferred polyanion compound for use in the first and second conductive electrodes of the electroluminescent device according to the present invention is poly(styrene sulphonic acid) and copolymers thereof with styrene.

Liquid Medium

According to a thirteenth embodiment of the composition, according to the present invention, the liquid medium comprises less than 20% by weight of water.

According to a fourteenth embodiment of the composition, according to the present invention, the liquid medium comprises less than 15% by weight of water, preferably less than 10% by weight of water and particularly preferably 5% by weight of water.

According to a fifteenth embodiment of the composition, according to the present invention, the liquid medium comprises at least 0.5% by weight of water and preferably at least 1% by weight of water.

According to a sixteenth embodiment of the composition, according to the present invention, the at least one non-aqueous solvent is selected from the group consisting of alcohols, ketones, arenes, esters, ethers, and their mixtures e.g. alcohols such as methanol, ethanol, 2-propanol, butanol, iso-amyl alcohol, octanol and cetyl alcohol; glycols such as ethylene glycol and glycerine; N-methylpyrrolidone; methoxy-propanol; and ketones such as 2-propanone and 2-butanone.

According to a seventeenth embodiment of the composition, according to the present invention, the at least one non-aqueous solvent is a glycol ether or a cyclic ether, such as tetrahydrofuran.

According to an eighteenth embodiment of the composition, according to the present invention, the at least one non-aqueous solvent is a di- or polyhydroxy- and/or carboxy groups or amide or lactam group containing organic compound. Examples of such organic compounds are N-methyl-2-pyrrolidinone; 2-pyrrolidinone; 1,3-dimethyl-2-imidazolidone; N,N,N',N'-tetramethyl-urea; formamide; sugar alcohols or sugar derivatives such as arabinose, saccharose, glucose, fructose and lactose; di- or polyalcohols such as sorbitol, xylitol, mannitol, mannose, galactose, sorbose, gluconic acid, ethylene glycol, propylene glycol, di- or tri(ethylene glycol), 1,1,1-trimethylol-propane, 1,2-propanediol, 1,3-propane-diol, 1,5-pentanediol, 1,2,3-propantriol, 1,2,4-butantriol, 1,2,6-hexantriol; and aromatic di- or polyalcohols such as resorcinol.

According to a nineteenth embodiment of the composition, according to the present invention, the at least one non-aqueous solvent is an aprotic compound with a dielectric constant greater than 15. Examples of such compounds are N-methylpyrrolidone, dimethyl sulphoxide and dimethyl formamide.

According to a twentieth embodiment of the composition, according to the present invention, the non-aqueous solvent is selected from the group consisting of 1,2-propanediol, propylene glycol, diethylene glycol, N-methylpyrrolidinone, N,N-dimethylformamide, N-methylacetamide, N,N-dimethylacetamide, glycerol, hexylene glycol and carbitol acetate.

According to a twenty-first embodiment of the composition, according to the present invention, the non-aqueous solvent is hydrophilic.

Compound with at Least Two Vinyl Groups

According to a twenty-second embodiment of the composition, according to the present invention, the at least one compound with at least two vinyl groups is UV-curable e.g. with N-vinyl-carbazole or vinyl-anthracene groups.

According to a twenty-third embodiment of the composition, according to the present invention, the compound with at least two vinyl groups comprises groups selected from the group consisting of acrylic acid, methacrylic acid, acrylate and methacrylate groups.

According to a twenty-fourth embodiment of the composition, according to the present invention, the compound with at least two vinyl groups is an aliphatic compound.

According to a twenty-fifth embodiment of the composition, according to the present invention, the compound with at least two vinyl groups is hydrophilic.

Suitable compounds with at least two vinyl groups include:

| Monomer nr | Product Code | description | Mn |
|---|---|---|---|
| 6 | CN435# SR9035# | ethoxylated$_{15}$ trimethylolpropane triacrylate | 956 |
| 7 | SR454# | ethoxylated$_3$ trimethylolpropane triacrylate | 428 |
| 8 | SR494# | ethoxylated$_4$ pentaerythritol tetra-acrylate | — |
| 9 | SR399# | dipentaerythritol penta-acrylate | 525 |
| 10 | SR351# | trimethylolpropane triacrylate | 296 |
| 11 | SR355# | ditrimethylol-propane tetra-acrylate | 482 |
| 12 | SR399LV# | low viscosity dipentaerythritol penta-acrylate | 525 |
| 13 | SR415# | ethyloxylated$_{20}$ trimethylolpropane triacrylate | 1176 |
| 14 | SR444D# | pentaerythritol triacrylate | 298 |
| 15 | SR492# | propoxylated$_3$ trimethylolpropane triacrylate | 470 |
| 16 | SR499# | ethyloxylated$_6$ trimethylolpropane triacrylate | 560 |
| 17 | SR502# | ethyloxylated$_9$ trimethylolpropane triacrylate | 692 |
| 18 | SR593# | ethoxylated$_5$ pentaerythritol triacrylate | — |
| 19 | SR610# | PEG600 diacrylate | 726 |
| 20 | SR344# | PEG400 diacrylate | 508 |
| 21 | SR259# | PEG200 diacrylate | 302 |
| 22 | SR272# | triethylene glycol diacrylate (TEGDA) | 258 |
| 23 | SR508# | dipropylene glycol diacrylate (DPGDA) | 252 |
| 24 | SR252# | PEG600 dimeth-acrylate | 736 |
| 25 | SR630OP# | PEG400 dimeth-acrylate | 598 |
| 26 | | tripropylene glycol diacrylate (TEGDA) | 303 | from Sartomer division of Cray Valley

UV-Photoinitiator

According to a twenty-sixth embodiment of the composition, according to the present invention, the at least one photoinitiator is selected from the group consisting of benzoin, benzoin ethers, benzil, benzil ketal derivatives, α-dialkoxy-acetophenones, α-hydroxy-alkyl-phenones, α-amino-alkyl-phenones, acyl-phosphine oxides, benzophenone, benzophenone derivatives, xanthones, amines, benzanthrone (BZA), thioxanthone derivatives, thioxanthone, thiotitanoces amines and Michler's Ketone derivatives 4,4'-bis(diethylamino)benzophenone (BEABP).

UV-photoinitiators suitable for use in the compositions of the present invention have to be compatible with a water-containing hydrophilic environment and to have a UV-light absorption compatible with the UV-light source used. Moreover, UV-photoinitiators suitable for use in the compositions of the present invention preferably do not evaporate, sublime, decompose or substantially lose their activity in other ways upon subjection to a short drying/heating step e.g. upon heating for 3 minutes at 130° C.

According to a twenty-seventh embodiment of the composition, according to the present invention, the at least one photoinitiator has a half-life of greater than 3 minutes when heated to 130° C.

Suitable UV-photoinitiators include both low molecular weight compounds and oligomers, such as the ESACURE® range of oligomer photoinitiators produced by Lamberti Spa. Furthermore, suitable UV-photoinitiators also include cationic and free radical UV-photoinitiators.

UV-photoinitiators suitable for use in the compositions of the present invention include:

| Initiator nr. | | λmax [nm] |
|---|---|---|
| 01 | acetophenone | |
| 02 | anisoin | |
| 03 | anthraquinone | |
| 04 | anthraquinone-2-sulphonic acid, sodium salt monohydrate | |
| 05 | benzanthrone (BZA) | 380 |
| 06 | (benzene) tricarbonylchromium | |
| 07 | Benzil [ESACURE ® KBO] | |
| 08 | Benzil dimethyl ketal [IRGACUR ® 651; ESACURE ® KB1; LUCIRIN ® BDK] | |
| 09 | Benzoin [Benzoin ® B; ULTRACURE ® 100] | |
| 10 | benzoin n-butyl ether [PS-11; DAITOCURE ® IB; VICURE ® 10; AIRCURE ® KB3] | |
| 11 | benzoin ethyl ether [PS-8A; DAITOCURE ® EE] | |
| 12 | benzoin isobutyl ether | |
| 13 | benzoin methyl ether | |
| 14 | Benzoin propyl ether [PS-10A; SEIKUOL ® BIP; DAITOCURE ® IP; SOLBATHRON ® BIPE] | |
| 15 | Benzophenone [KAYACURE ® BP; UVESORATOR ® 200] | |
| 16 | benzophenone/1-hydroxycyclohexyl phenyl ketone 50/50 blend [IRGACUR ® 500; ESACURE ® HB] | 250, 332 |
| 17 | benzophenone/methyldiethanolamine | |
| 18 | 3,3',4,4'-benzophenonetetra-carboxylic dianhydride | |
| 19 | 4-benzoyl-biphenyl | |
| 20 | 2-benzyl-2-(dimethylamino(-4'-morpholinobutyro-phenone [IRGACUR 369] | 233, 324 |
| 21 | 4,4'bis(diethylamino)benzophenone [Michler's Ketone derivatives 4,4'-bis(diethylamino)-benzophenone (BEABP)] | 352 |
| 22 | 4,4'bis(dimethylamino)benzophenone | |
| 23 | camphorquinone | |
| 24 | 2-chlorothioxanthen-9-one [2-chloro-thioxanthone (2CTX)] | 370, 385 |
| 25 | (cumene)cyclopentadienyliron(II)-hexafluorophosphate | |
| 26 | 2-methylbenzophenone | |
| 27 | dibenzosuberenone | |
| 28 | 2,4-dichloro-thioxanthen [KYACURE ® RTX] | |
| 29 | 2,2-diethoxyacetophenone [DEAP] | |
| 30 | 2,4-diethyl-thioxanthen [KAYACURE ® DETX-S] | |
| 31 | 4,4'-dihydroxybenzophenone | |
| 32 | 2,2-dimethoxy-2-phenylacetophenone | |
| 33 | 4-(dimethylamino)benzophenone | |
| 34 | 4,4'-dimethylbenzil | |
| 35 | 2,5-dimethylbenzophenone | |
| 36 | 2,4-dimethyl-thioxanthen [KAYACURE ® RTX] | |
| 37 | diphenyl (2,4,6-trimethylbenzoyl)-phosphino oxide [DAROCUR TPO; ESACURE ® TPO] | 295, 368, 380, 393 |
| 38 | diphenyl(2,4,6-trimethylbenzoyl)-phosphino oxide/2-hydroxy-2-methyl-propiophenone 50/50 blend [DAROCUR ® 4265] | |
| 39 | Esacure KIP 100F | |
| 40 | Esacure KIP EN | |
| 41 | 4'-ethoxy-acetophenone | |
| 42 | 2-ethyl-anthraquinone | |
| 43 | 2-ethylhexyl-4-dimethyl amino benzoate [ESACURE ® EHA] | |
| 44 | ferrocene | |
| 45 | α-hydroxyacetophenone | |

| Initiator nr. | | λmax [nm] |
|---|---|---|
| 46 | 3'-hydroxyacetophenone | |
| 47 | 4'-hydroxyacetophenone | |
| 48 | 3-hydroxybenzophenone | |
| 49 | 4-hydroxybenzophenone [UVECRYL ® P36] | |
| 50 | 1-hydroxycyclohexyl phenyl ketone [IRGACUR ® 184; DOUBLECURE ® 395; ESACURE ® KS300] | 246, 280, 333 |
| 51 | 2-hydroxy-2-methylpropiophenone [DAROCUR ® 1173; ESACURE ® KL200] | 245, 280, 331 |
| 52 | 2-hydroxy-4'-(2-hydroxyethoxy)-2-methylpropio-phenone [Darocur ® 2959] | 276 |
| 53 | 2-isopropyl-thioxanthen [QUANTACURE ® ITX; ESACURE ® ITX] | |
| 54 | 2-methylbenzophenone | |
| 55 | 3-methylbenzophenone | |
| 56 | Methylbenzoylformate [DAROCUR ® MBF] | 255, 325 |
| 57 | 2-methyl-4'-(methylthio)-2-morpholinopropiophenone [IRGACUR 907] | 230, 304 |
| 58 | phenanthrenequinone | |
| 59 | oligo (2-hydroxy-2-methyl-1-4 (1-methylvinyl) phenyl propanone and 2-hydroxy-2-methyl-1-phenyl-1-propanone (monomeric) [ESACURE KIP 100F] | |
| 60 | oligo (2-hydroxy-2-methyl-1-4 (1-methylvinyl) phenyl propanone and 2-hydroxy-2-methyl-1-phenyl-1-propanone (polymeric)[ESACURE KIP 150] | |
| 61 | oligo (2-hydroxy-2 methyl-1-4 (1-methylvinyl) phenyl propanone (emulsion) [ESACURE KIP EM] | |
| 62 | 65% (oligo[2-hydroxy-2-methyl-1-[4-(1-methyl-vinyl)phenyl] propanone] and 35% propoxylated glyceryl triacrylate [ESACURE KIP IT] | |
| 63 | 4'-phenoxy-acetophenone | |
| 64 | phenyl(2,4,6-trimethylbenzoyl)phosphino oxide [IRGACUR ® 819DW] | 295, 370 |
| 65 | thioxanthen-9-one [thioxanthone] | 366, 378 |
| 66 | triarylsulfonium hexafluoroantimonate salts mixed | |
| 67 | trifluorosulfonium hexafluorophosphate salts mixed | |
| 68 | trimethylbenzophenone and methylbenzophenone [ESACURE ® TZT] | |

According to a twenty-eighth embodiment of the composition, according to the present invention, the at least one photoinitiator is exclusive of a monodiazonium salt, a multi-diazonium salt and a resin comprising a diazonium salt.

Binder

According to a twenty-ninth of the composition, according to the present invention, the composition further comprises at least one binder. This binder binds together the ingredients of the antistatic or electroconductive layer produced with the composition according to the present invention such that a non-planar structure on a support can be better coated. This binder may also increase the viscosity of the composition produced according to the method of the present invention.

According to a thirtieth embodiment of the composition, according to the present invention, the composition further comprises at least one binder selected from the group consisting polyacrylates, carboxymethylcellulose, polyvinylpyrrolidone, hydroxypropylcellulose, carboxylate-containing copolymers with sulfonic acid groups, hydroxy-modified acrylic acid copolymers and poly(vinyl alcohol).

The suitability of binders was assessed by adding 0.1% by weight of the particular binder to a typical dispersion medium for the PEDOT/PSS-containing compositions of the present invention such as 87% by weight of 1,2-propanediol, 9% by weight of diethylene glycol, 3% by weight of deionized water, 0.5% by weight of ZONYL® FSO and 0.5% by weight of silicone antifoam agent X50860A. A binder which dissolved in such a dispersion medium to the extent of 0.1% by weight was regarded as suitable for the compositions according to the present invention.

Particularly suitable binders are:
Binder 01=CARBOPOL® ETD-2623, a homo- and copolymers of acrylic acid crosslinked with a polyalkenyl polyether, from B. F. Goodrich;
Binder 02=CARBOPOL® Aqua 30, a latex of a copolymer of acrylic acid and ethyl acrylate from B. F. Goodrich;
Binder 03=AMBERGUM® 3021, a carboxymethylcellulose from Hercules Inc;
Binder 04=LUVISKOL® K30, a polyvinyl pyrrolidone from BASF;
Binder 05=a hydroxyalkyl cellulose methylpropylether from Shin-Etsu Chemical Company;
Binder 06=KLUCEL® L, hydroxypropylcellulose from Hercules Inc.;
Binder 07=NEOCRYL® BT24, an acrylate-based aqueous latex from Zenica;
Binder 08=AQUACER® 503, an acrylate-based aqueous latex from BYC Cera;
Binder 09=POLYPHOBE® TR117, an acrylate-based aqueous latex from Union Carbide;
Binder 10=AMOREX® CR2900, an acrylate-based aqueous latex from Westvaco Corporation;
Binder 11=CRX-8057-45, an acrylate-based aqueous latex from Westvaco Corporation;
Binder 12=PRIMAL™ EP-5380, a 54% by weight acrylate-based aqueous latex from Rohm and Haas;
Binder 13=JAGOTEX® KEM1020, a 58% by weight acrylate-based aqueous latex from Ernst Jager Chem. Rohstoffe GmbH;
Binder 14=PERMUTEX® PS-34=320, a 54% by weight acrylate-based aqueous latex from Stahl Holland BV;

Binder 15=JAGOTEX® KEM4009, a 55% by weight acrylate copolymer aqueous latex from Ernst Jager Chem. Rohstoffe GmbH;
Binder 16=GOOD RITE® K797, a 50% by weight acrylic acid-AMPS copolymer aqueous latex from B. F. Goodrich;
Binder 17=GOOD RITE® K-7058, a 50% by weight water-soluble acrylic acid polymer from B. F. Goodrich;
Binder 18=NARLEX® DX2020, an acrylic acid/styrene copolymer latex from Alco Chemical;
Binder 19=ALCOPERSE® 725, an acrylic acid/styrene copolymer latex from Alco Chemical;
Binder 20=CARBOPOL® EP2, a 18.1% by weight non-crosslinked methacrylate acid/ethyl acrylate copolymer latex from B. F. Goodrich
Binder 21=97.5-99.5% hydrolyzed poly(vinyl alcohol) from WACKER CHEMIE.
Binder 22=DISPERCOLL™ U VP KA 8481, a polyester urethane copolymer dispersion from BAYER
Binder 23=NEOREZ™ R9330, a non-ionic polyurethane-polyester from DSM
Binder 24=VYLONAL™ MD1220, a 25 wt % aqueous copolyester dispersion from TOYOBO
Binder 25=VYLONAL™ MD1245, a 30 wt % aqueous copolyester dispersion from TOYOBO
Binder 26=VYLONAL™ MD1480, a 25 wt % aqueous copolyester dispersion from TOYOBO
Binder 27=EASTEK™ 1200, a sulfopolyester from Eastman Binders 1, 2 and 20 have a very strong influence upon the viscosity of the dispersion independent of the PEDOT/PSS-content.

Pigments and Dyes

According to a thirty-first embodiment of the composition, according to the present invention, the composition further comprises a pigment or a dye. A coloured or non-transparent composition is thereby realized. Transparent coloured compositions can be realized by incorporating coloured dyes or pigments e.g. diazo and phthalocyanine pigments.

Non-transparent compositions can also be realized by incorporating a black pigment such as LEVANYL® A-SF from BAYER, LEVANYL® NLF from BAYER, KL1925, a carbon black dispersion from Degussa, and MHI Black 8102M, a carbon black dispersion from Mikuni, or titanium dioxide pigments in a weight sufficient to give non-transparency in the layer thickness being coated.

Suitable pigments are:

| Pigment nr. | Pigment | Manufacturer | |
|---|---|---|---|
| PIG01 | FLEXONYL® Blue B2G | CLARIANT | 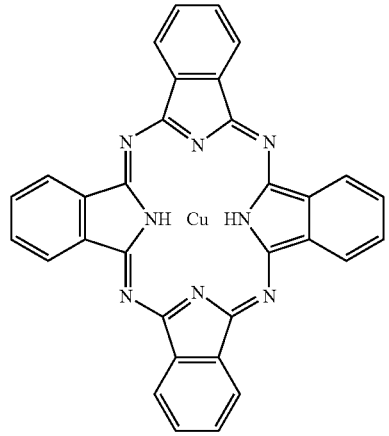 |
| PIG02 | LEVANYL® Yellow HR-LF | BAYER | 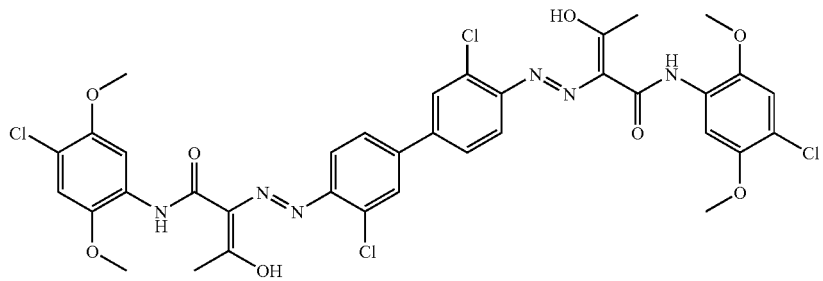 |

-continued
| Pigment nr. | Pigment | Manufacturer | |
|---|---|---|---|
| PIG03 | NOVOPERM ® Yellow HR02 | CLARIANT | 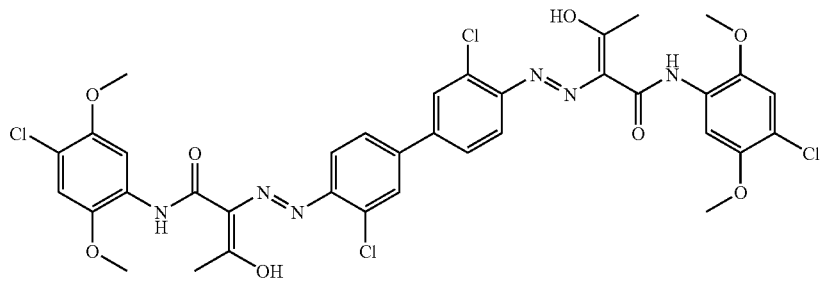 |
| PIG04 | LEVANYL ® Blue G-LF | BAYER | 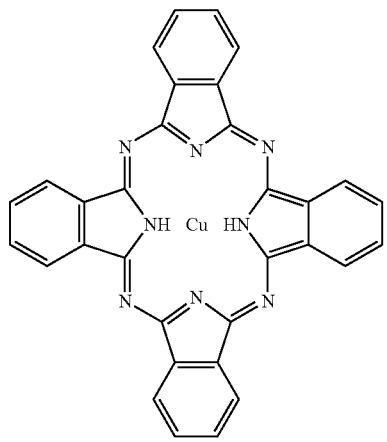 |
| PIG05 | HOSTAPERM ® Blue B2G | CLARIANT | 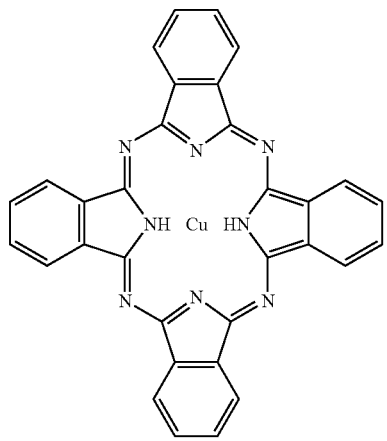 |
| PIG06 | HOSTAPERM ® Blue B2G-L | CLARIANT | 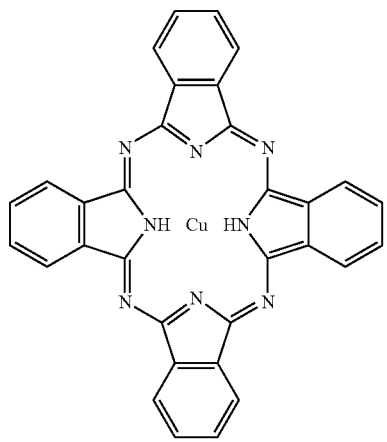 |

| Pigment nr. | Pigment | Manufacturer | |
|---|---|---|---|
| PIG07 | LEVANYL ® N-LF | BAYER | a carbon black pigment dispersed in water |
| PIG08 | LEVANYL ® A-SF | BAYER | a carbon black pigment dispersed in water |
| PIG09 | MHI 8102M | DEGUSSA | a carbon black pigment dispersed in water |
| PIG10 | GA Black 1 | Mikuni Color Ltd | a carbon black pigment dispersed in water |
| PIG11 | Bonjet Black CW-2 | Orient Chemicals Industries | a carbon black pigment dispersed in water |
| PIG12 | Bonjet Black CW-1 | Orient Chemicals Industries | a carbon black pigment dispersed in water |
| PIG13 | FX-GBI-015 | Nagase Nippon Shokubai | a carbon black pigment dispersed in 2-butanone (50-80%) + methylisobutylketone (8-20%) |
| PIG14 | LEVANYL ® B-LF | BAYER | a carbon black pigment dispersed in water |
| PIG15 | TPX100 | CABOT CORP | a 20% dispersion of a modified carbon black in water |
| PIG16 | TPX100 | CABOT CORP | a 15% dispersion of a modified carbon black in water |

Process for Preparing a Composition

Aspects of the present invention are realized by a process for preparing a composition, according to the present invention, the preparation process comprising the steps of: providing a dispersion or solution of a polyanion and a polymer or copolymer of a substituted or unsubstituted thiophene in a polyhydroxy-solvent-containing liquid medium comprising at least 70% by weight of organic solvents, the balance being water; and adding at least one photoinitiator and at least one monomer; and mixing the resulting mixture. This composition may be an ink or paste.

According to a first embodiment of the process for preparing a composition, according to the present invention, the ink or paste is a screen-printing ink or paste.

According to a second embodiment of the process for preparing a composition, according to the present invention, the mixing of the ingredients is performed at a temperature of 35° C. or lower, with a temperature of 30° C. or lower being preferred.

According to a third embodiment of the process for preparing a composition, according to the present invention, at least one initiator is added as a solution or dispersion in at least one monomer.

According to a fourth embodiment of the process for preparing a composition, according to the present invention, a solvent is added.

According to a fifth embodiment of the process for preparing a composition, according to the present invention, a surfactant is added.

According to a sixth embodiment of the process for preparing an ink or paste, according to the present invention, an adhesion promotor is added.

According to a seventh embodiment of the process for preparing a composition, according to the present invention, a defoaming agent is added e.g. ethanol.

Process for Producing a Layer or Pattern on an Object

Aspects of the present invention are realized by a process for producing a layer or pattern on an object comprising the steps of: (i) applying to said object a layer or pattern with a composition comprising a polyanion and a polymer or copolymer of a substituted or unsubstituted thiophene as a solution or as a dispersion in a liquid medium and at least one compound with at least two vinyl groups, wherein said liquid medium comprises at least one non-aqueous solvent and has less than 30% by weight of water; and said composition is capable of UV-photopoly-merization due to said composition comprising at least one vinyl-compound capable of initiating UV-photopolymerization and/or at least one UV-photoinitiator; (ii) optionally drying said layer or pattern; (iii) optionally heating said layer or pattern to reduce the surface resistance thereof; and (iii) curing said layer or pattern by exposing to UV-light.

The step of heating the layer or pattern to reduce the surface resistance thereof is a process in which the conductivity of the layer or pattern is enhanced e.g. by heating the polymer or copolymer of a substituted or unsubstituted thiophene in the presence of high boiling point liquids such as di- or polyhydroxy- and/or carboxy groups or amide or lactam group comprising organic compound at elevated temperature, preferably between 100 and 250° C., during preferably 1 to 90 seconds. Alternatively in the case of the presence of aprotic compounds with a dielectric constant $\geq 15$, e.g. N-methylpyrrolidinone, temperatures below 100° C. can be used. Particularly preferred liquids for such treatment are N-methylpyrrolidinone and diethylene glycol such as disclosed in EP-A 686 662 and EP-A 1 003 179.

According to a first embodiment of the process for producing a layer or pattern on an object, according to the present invention, the process further comprises a step of preparing a solution or a dispersion of a polyanion and a polymer or copolymer of a substituted or unsubstituted thiophene in a liquid medium comprising at least one non-aqueous solvent and less than 30% by weight of water from an aqueous solution or dispersion of the polyanion and the polymer or copolymer of a substituted or unsubstituted thiophene by replacing water in an aqueous solution or dispersion of the polyanion and the polymer or copolymer of the substituted or unsubstituted thiophene by the at least one non-aqueous solvent. This replacement of water can be carried out by any of the processes disclosed in WO 02/067273A, WO 02/072660A, WO 02/072714A1, WO 03/048228A and WO 03/048229A.

According to a second embodiment of the process for producing a layer or pattern on an object, according to the present invention, the layer or pattern is subjected to conductivity enhancement subsequent to exposure to UV-light by contact with a high boiling point liquid, such as di- or polyhydroxy- and/or carboxy groups or amide or lactam group comprising organic compound followed by heating at an elevated temperature.

According to a third embodiment of the process for producing a layer or pattern on an object, according to the present invention, steps (ii) and (iii) are performed in combination in a heating step during which the surface resistance of the layer or pattern is reduced and said layer or pattern is dried, preferably at a temperature at or below 120° C. with a temperature at or below 110° C. being particularly preferred.

According to a fourth embodiment of the process for producing a layer or pattern on an object, according to the present invention, said layer or pattern is substantially transparent.

According to a fifth embodiment of the process for producing a layer or pattern on an object, according to the present invention, the method used for applying said composition is a printing process.

According to a sixth embodiment of the process for producing a layer or pattern on an object, according to the present invention, the method used for applying said composition is a printing process selected from the group consisting of: screen printing, flexographic printing, stamp printing, tampon printing, gravure printing, lithographic printing and offset printing.

Object

According to a seventh embodiment of the process, according to the present invention, the object is a transparent or translucent support.

According to an eighth embodiment of the process, according to the present invention, the object is rigid or flexible and consists of a glass, a glass-polymer laminate, a polymer laminate, a thermoplastic polymer or a duroplastic polymer. Examples of thin flexible supports are those made of a cellulose ester, cellulose triacetate, polypropylene, polycarbonate or polyester, with polyethylene terephthalate or polyethylene naphthalene-1,4-dicarboxylate being particularly preferred.

Layer or Pattern

Aspects of the present invention are realized by a layer or pattern obtainable by a process for producing a layer or pattern on an object according to the present invention.

According to a first embodiment of the layer or pattern, according to the present invention, the layer or pattern is an electrode.

According to a second embodiment of the layer or pattern, according to the present invention, the layer or pattern is water-resistant.

According to a third embodiment of the layer or pattern, according to the present invention, the layer or pattern is transparent.

Print

Aspects of the present invention are realized by a print obtainable by a process for producing a layer or pattern on an object according to the present invention.

According to a first embodiment of the print, according to the present invention, the print is an electrode.

According to a second embodiment of the print, according to the present invention, the print is water-resistant.

According to a third embodiment of the print, according to the present invention, the print is transparent.

INDUSTRIAL APPLICATION

The composition and ink according to the present invention can be used in the production of UV-photopolymerizable conductive layers, patterns and prints with excellent adhesion, abrasion resistance, water resistance and solvent resistance for a multiplicity of applications.

The invention is illustrated hereinafter by way of COMPARATIVE EXAMPLES and INVENTION EXAMPLES. The percentages and ratios given in these examples are by weight unless otherwise indicated.

| | |
|---|---|
| Support 01 = | a 175 µm thick heat-stabilized polyethylene terephthalate sheet coated with subbing layer 01; |
| Support 02 = | Autostat CT7, a 175 µm thick heat-stabilized poly(ethylene terephthalate) [PET] subbed on both sides with an acrylate adhesion layer supplied by AUTOTYPE INTERNATIONAL LTD; |
| Support 03 = | Melinex ST 506, a 175 µm thick heat-stabilized poly(ethylene terephthalate) [PET] subbed with an acrylate adhesion layer; |
| Support 04 = | a 120 µm thick unsubbed heat-stabilized biaxially oriented polyethylene terephthalate sheet; |
| Support 05 = | a 120 µm thick unsubbed amorphous polyethylene terephthalate; |
| Support 06 = | smooth side of Macrofol DE 1-4, a 125 µm thick polycarbonate sheet; |
| Support 07 = | mat side of Macrofol DE 1-4, a 125 µm thick polycarbonate sheet. |

Subbing layer Nr. 01 (V664/14) has the composition:

| | |
|---|---|
| copolymer of 88% vinylidene chloride, 10% methyl acrylate and 2% itaconic acid | 79.1% |
| Kieselsol ® 100F, a colloidal silica from BAYER | 18.6% |
| MERSOLAT ® H, a surfactant from BAYER | 0.4% |
| ULTRAVON ® W, a surfactant from Ciba-Geigy | 1.9% |

PEDOT Paste 01

The starting material for the preparation of the PEDOT pastes described in the INVENTION EXAMPLES was a 1.2% by weight aqueous dispersion of PEDOT/PSS comprising a weight ratio PEDOT to PSS of 1:2.46 prepared in the substantial absence of oxygen as disclosed in WO 03/048227A1.

92.5 kg of a substantially water-free dispersion of 0.830 wt % dispersion of PEDOT/PSS (2.0 wt % water) was produced from 64 kg of a 1.2 wt % aqueous dispersion of PEDOT/PSS, 86.4 kg of 1,2-propanediol and 8.727 kg of diethylene glycol using the process disclosed in WO 03/048228A.

PEDOT Paste

The starting material for the preparation of the PEDOT pastes described in the INVENTION EXAMPLES was a 1.14% by weight aqueous dispersion of PEDOT/PSS comprising a weight ratio PEDOT to PSS of 1:2.46 prepared in the substantial absence of oxygen as disclosed in WO 03/048227A1.

92.5 kg of a substantially water-free dispersion of 0.789 wt % dispersion of PEDOT/PSS (2.1 wt % water) was produced from 64 kg of a 1.065 wt % aqueous dispersion of PEDOT/PSS, 86.4 kg of 1,2-propanediol and 9.6 kg of diethylene glycol using the process disclosed in WO 03/048228A.

PEDOT Paste 03

The starting material for the preparation of the PEDOT pastes described in the INVENTION EXAMPLES was a 1.2% by weight aqueous dispersion of PEDOT/PSS comprising a weight ratio PEDOT to PSS of 1:2.46 prepared in the substantial absence of oxygen as disclosed in WO 03/048227A1.

PEDOT paste 04 was prepared by mixing the above-mentioned 1.2% by weight aqueous dispersion of PEDOT/PSS with diethylene glycol, n-propanol, Zonyl® FSO100 and Binder 01 and adding ammonium hydroxide to adjust the pH, thereby producing PEDOT past 04 with the following composition:

| | |
|---|---|
| 1.2% by weight aqueous dispersion of PEDOT/PSS | 100 g |
| diethyleneglycol | 97 g |
| n-propanol | 10 g |
| zonyl FSO 100 | 0.2 g |
| ammoniak (25% in water) | 2.1 g |
| Binder 01 | 1 g |
| total | 210.3 g |

Comparative Examples 1 to 9

The compositions of COMPARATIVE EXAMPLES 1 to 9 were prepared using a 1.2% by weight aqueous dispersion of PEDOT/PSS with a PEDOT:PSS weight ratio of 1:2.4 prepared in the substantial absence of oxygen as disclosed in WO 03/048227A1.

The composition of the compositions of COMPARATIVE EXAMPLES 1 to 9 are given in Table 1 below.

TABLE 1

| | Comparative Example nr. | | | | | | | | |
|---|---|---|---|---|---|---|---|---|---|
| | 1 | 2 | 3 | 4 | 5 | 6 | 7 | 8 | 9 |
| INITIATOR 52 [wt %] | 1.3 | 2.5 | 4.0 | 4.7 | 4.9 | 1.9 | 2.3 | 2.4 | 3.4 |
| MONOMER 6 [wt %] | 1.3 | 2.5 | 4.0 | 4.7 | 4.9 | 6.2 | 7.6 | 8.0 | 3.4 |
| MONOMER 7 [wt %] | 11.4 | 22.9 | 35.7 | 42.4 | 44.5 | 55.9 | 68.2 | 72.0 | 30.5 |
| N-methyl-pyrrolidone [wt %] | 7.6 | 15.3 | 23.8 | 28.3 | 29.7 | 10.0 | 10.0 | 10.0 | 10.0 |
| Zonyl ® FSO100 [wt %] | 0.3 | 0.5 | 0.8 | 0.9 | 1.0 | 1.2 | 1.5 | 1.6 | 0.7 |
| 3-glycidoxypropyltrimethoxysilane [wt %] | 1.0 | 1.0 | 1.0 | 1.0 | 1.0 | 1.0 | 1.0 | 1.0 | 1.0 |
| 1.2 wt % PEDOT/PSS aqueous dispersion [wt %] | 75.7 | 51.0 | 23.8 | 9.4 | 4.9 | 23.8 | 9.4 | 5.0 | 51.0 |
| water [wt %] | 1.6 | 4.2 | 7.0 | 8.4 | 9.0 | — | — | — | — |

The compositions of COMPARATIVE EXAMPLES 1 to 9 were coated to wet thicknesses of 6, 12 and 24 µm, dried for 10 minutes at 80° C. in a belt oven and then cured by passing 6 times at 20 m/min through a model DRSE-120 Conveyor from Fusion Systems Ltd. with a D-bulb UV-lamp, having a power of 6000 W, an emission in the 200-400 nm range and an effective exposure length of 27 cm. The UV-output in this apparatus at 20 m/min throughput has been assessed in the four different transmission bands as: UVA=320-390 nm; UVB=280-320 nm; UVC=250-260 nm; and UVV=395-445 nm as follows: UVA=764 mJ cm$^{-2}$; UVB=213 mJ cm$^{-2}$; UVC=14 mJ cm$^{-2}$; UVV=715 mJ cm$^{-2}$ with peak intensities of: UVA=5007 mW cm$^{-2}$; UVB=1333 mW cm$^{-2}$; UVC=91 mW cm$^{-2}$; UVV=4831 mW cm$^{-2}$.

The thickest layers coated with the composition of COMPARATIVE EXAMPLE 1 gave the lowest surface resistance of 1900 Ω/square, but at a visible light transmission of 87%. Furthermore, thinner layers with the same coating composition gave a surface resistance of 15800 Ω/square at a visible light transmission of 97%. These surface resistance values are significantly higher than those obtained with inks having a liquid medium with less than 30% by weight of water.

Invention Examples 1 to 4

The compositions of INVENTION EXAMPLES 1 to 4 were prepared using PEDOT paste 01 as follows with the quantities given in Table 1 below: the 3-glycidoxypropyltrimethoxy-silane was added to PEDOT paste 01 while stirring at 3000 rpm, then after waiting 5 minutes with stirring the Zonyl® FSO100 was added with stirring, then after waiting 60 minutes the ethanol was added slowly with stirring, a further 5 minutes was waited with stirring before adding a premixed mixture of INITIATOR 52 and MONOMERS 6 and 7 with stirring to produce the final composition. The viscosities of the resulting screen printing ink were determined at 25° C. using a Brookfield DVII+PRO cone and plate viscometer at a shear rate of 0.1 s$^{-1}$. The compositions and viscosities of the compositions of INVENTION EXAMPLES 1 to 4 are given in Table 2 below:

TABLE 2

| | Invention Example nr. | | | |
|---|---|---|---|---|
| | 1 | 2 | 3 | 4 |
| INITIATOR 52 [g] | 0.99 | 1.98 | 3.96 | 1.58 |
| MONOMER 6 [g] | 8.91 | 17.82 | 35.65 | 14.26 |
| MONOMER 7 [g] | 0.99 | 1.98 | 3.96 | 1.58 |
| Wt % monomer in PEDOT paste | 1 | 2 | 4 | 8 |

TABLE 2-continued

| | Invention Example nr. | | | |
|---|---|---|---|---|
| | 1 | 2 | 3 | 4 |
| 3-glycidoxypropyltrimethoxysilane [g] | 5.35 | 5.35 | 5.35 | 1.04 |
| Zonyl ® FSO100 [g] | 2.68 | 2.68 | 2.68 | 0.52 |
| Ethanol [g] | 21.46 | 21.46 | 21.46 | 4.15 |

TABLE 2-continued

| | Invention Example nr. | | | |
|---|---|---|---|---|
| | 1 | 2 | 3 | 4 |
| PEDOT paste 01 [g] | 904.51 | 904.51 | 904.51 | 174.87 |
| viscosity [mPas] | 27500 | 33000 | 29000 | 37000 |

The compositions of INVENTION EXAMPLES 1 to 4 were screen-printed at 300 mm/s with a 79 mesh on support 02, then dried for 3 minutes at 130° C. before curing by passing 9 times for the composition of INVENTION EXAMPLE 1, twice for the compositions of INVENTION EXAMPLES 2 and 3 and once for the composition of INVENTION EXAMPLE 4 all at 20 m/min through a model DRSE-120 Conveyor from Fusion Systems Ltd. with a D-bulb UV-lamp, having a power of 6000 W, an emission in the 200-400 nm range and an effective exposure length of 27 cm. The UV-output in this apparatus at 20 m/min throughput has been assessed in the four different transmission bands as: UVA=320-390 nm; UVB=280-320 nm; UVC=250-260 nm; and UVV=395-445 nm as follows: UVA=764 mJ cm$^{-2}$; UVB=213 mJ cm$^{-2}$; UVC=14 mJ cm$^{-2}$; UVV=715 mJ cm$^{-2}$ with peak intensities of: UVA=5007 mW cm$^{-2}$; UVB=1333 mW cm$^{-2}$; UVC=91 mW cm$^{-2}$; UVV=4831 mW cm$^{-2}$.

The optical densities of the prints together with the support were measured in transmission with a MacBeth TR924 densitometer with a visible filter together with the visible light transmission values are given in Table 3 below for screen-printed prints obtained with different meshes with the compositions of INVENTION EXAMPLES 1 to 4.

The surface resistances at room temperature were determined by contacting the outermost layer with parallel electrodes each 45 mm long and 45 mm apart capable of forming line contacts with copper electrodes via silver-filled rubber, the electrodes being separated by a teflon insulator. This enables a direct measurement of the surface resistance to be realized. The surface resistance values for screen-printed prints obtained with different meshes with the compositions of INVENTION EXAMPLES 1 to 4 are also given in Table 3 below.

TABLE 3

| | Invention Example nr | | | | | | |
|---|---|---|---|---|---|---|---|
| | 2 | 3 | | | 4 | | |
| mesh | P79 | P79 | P35 | P62 | P79 | P150 | P180 |
| SR# [Ω/square] | 885 | 843 | 551 | 919 | 1179 | 4143 | 6350 |
| Optical density | 0.24 | 0.21 | 0.445 | 0.265 | 0.205 | 0.08 | 0.06 |
| wet thickness [μm] | — | — | 72.8 | 38 | 27.8 | 13.5 | 11.1 |

SR = surface resistance

A surface resistance of 551 Ω/square at an optical density of 0.445 was realized upon screen-printing the composition of INVENTION EXAMPLE 4

These screen-printing inks were found to be stable, there being no change in viscosity and also no change in the surface resistance realized upon screen printing and curing as described below.

Comparative Examples 10 to 12

The compositions of COMPARATIVE EXAMPLES 10 to 12 were prepared from a 1.2% by weight aqueous dispersion of PEDOT/PSS comprising a weight ratio PEDOT to PSS of 1:2.4 prepared in the substantial absence of oxygen as disclosed in WO 03/048227A1 by adding with stirring 3-glycidyloxypropyl-trimethoxysilane, Zonyl® FSO100, N-methyl-pyrrolidone and various monomers and Initiator 52 to produce the compositions of COMPARATIVE EXAMPLES 10 to 12. The viscosity at 25° C. of the resulting screen printing ink was too low to be determined using a Brookfield DVII+PRO cone and plate viscometer at a shear rate of 0.1 s$^{-1}$. The compositions of the compositions of COMPARATIVE EXAMPLE 6 to 8 are given in Table 4 below:

TABLE 4

| | COMPARATIVE EXAMPLE | | |
|---|---|---|---|
| | 10 | 11 | 12 |
| Initiator 52 [g] | 0.5 | 0.5 | 0.5 |
| Monomer 6 [g] | 4.5 | 4.5 | 4.5 |
| Monomer 7 [g] | 0.5 | — | — |
| Monomer 8 [g] | — | 0.5 | — |
| Monomer 9 [g] | — | — | 0.5 |
| N-methyl-pyrrolidone | 3.0 | 3.0 | 3.0 |
| 3-glycidoxypropyltri-methoxysilane [g] | 0.1 | 0.1 | 0.1 |
| Zonyl FSO100 (1 wt % aqueous solution) [g] | 1.0 | 1.0 | 1.0 |
| 1.2 wt % aqueous PEDOT/PSS dispersion [g] | 30 | 30 | 30 |
| Surface resistance [Ω/square] | 1600 | 1700 | 1200 |
| Scratch resistance | 4 | 3 | 3 |

The layers were coated with a 40 μm Braive coating knife on support 02 PET/V109, dried for 10 minutes at 80° C. and cured with a model DRSE-120 Conveyor from Fusion Systems Ltd. with a D-bulb UV-lamp, passing 3 times under the UV-source (intensity 100%) at a speed of 20 m/min.

The cured coatings were transparent, hard and not sticky. Especially the coating produced with COMPARATIVE EXAMPLE 10 was found to be very scratch resistant. However, all the layers had a rough surface, which meant that the scratch resistance could only be determined manually by rubbing 10 times with a nail. The damage resulting from nail-rubbing was assessed as follows:

| 4 = | no damage |
|---|---|
| 3 = | lightly damaged |
| 2 = | layer partially removed |
| 1 = | layer removed |

Invention Examples 5 to 8

The compositions of INVENTION EXAMPLES 5 to 8 were prepared using PEDOT paste 02 as follows with the quantities given in Table 5 below: the 3-glycidoxypropyltri-methoxy-silane was added to PEDOT paste 02 while stirring at 3000 rpm, then after waiting 5 minutes with stirring the Zonyl® FSO100 was added with stirring, then after waiting 60 minutes the ethanol was added slowly with stirring, a further 5 minutes was waited with stirring before adding a premixed mixture of INITIATOR 52 and MONOMERS 6 and 7 with stirring for 60 minutes to produce the final composition. The viscosities of the resulting screen printing ink were determined at 25° C. using a Brookfield DVII+PRO cone and plate viscometer at a shear rate of 0.1 s$^{-1}$. The compositions and viscosities of the compositions of INVENTION EXAMPLES 5 to 8 are given in Table 5 below:

TABLE 5

| | Invention Example nr. | | | |
|---|---|---|---|---|
| | 5 | 6 | 7 | 8 |
| INITIATOR 52 [g] | 0.297 | 0.594 | 1.188 | 2.376 |
| MONOMER 6 [g] | 2.673 | 5.346 | 10.692 | 21.384 |
| MONOMER 7 [g] | 0.297 | 0.594 | 1.188 | 2.376 |
| Wt % monomer in PEDOT paste | 1 | 2 | 4 | 8 |
| 3-glycidoxypropyltri-methoxysilane [g] | 1.61 | 1.61 | 1.61 | 1.61 |
| Zonyl ® FSO100 [g] | 0.80 | 0.80 | 0.80 | 0.80 |
| Ethanol [g] | 6.44 | 6.44 | 6.44 | 6.44 |
| PEDOT paste 02 [g] | 271.35 | 271.35 | 271.35 | 271.35 |
| viscosity [mPas] | 27.38 | 27.26 | 28.12 | 24.19 |

The compositions of INVENTION EXAMPLES 1 to 4 were screen-printed at 300 mm/s with a 79 mesh on support 02, then dried for 3 minutes at 130° C. before curing by passing 3 times for the compositions of INVENTION EXAMPLES 5, 6 and 7; and twice for the composition of INVENTION EXAMPLE 8 through an AKTIPRINT T UV table dryer from Technigraf GmbH at a throughput of 20 m/min at 100% UV lamp power. The UV-output in this apparatus at 5 m/min throughput has been assessed in the four different transmission bands as: UVA=320-390 nm; UVB=280-320 nm; UVC=250-260 nm; and UVV=395-445 nm as follows: UVA=629 mJ cm$^{-2}$ (i.e. 158 mJ cm$^{-2}$ at 20 m/min); UVB=577 mJ cm$^{-2}$ (i.e. 144 mJ cm$^{-2}$ at 20 m/min); UVC=80 mJ cm$^{-2}$ (i.e. 20 mJ cm$^{-2}$ at 20 m/min); UVV=383 mJ cm$^{-2}$ (i.e. 96 mJ cm$^{-2}$ at 20 m/min) with peak intensities of: UVA=820 mW cm$^{-2}$; UVB=771 mW cm$^{-2}$; UVC=109 mW cm$^{-2}$; UVV=480 mW cm$^{-2}$.

The optical densities of the prints together with the support were measured in transmission with a MacBeth TR924 densitometer with a visible filter are given in Table 6 below for screen-printed prints obtained with the compositions of INVENTION EXAMPLES 5 to 8.

The haze of the prints was determined with a Haze-gard plus apparatus from BYK Gardner according to ASTM D1003 and is also given is in Table 6 below for the compositions of INVENTION EXAMPLES 5 to 8.

The surface resistances at room temperature were determined by contacting the outermost layer with parallel electrodes each 45 mm long and 45 mm apart capable of forming line contacts with copper electrodes via silver-filled rubber, the electrodes being separated by a teflon insulator. This enables a direct measurement of the surface resistance to be realized. The surface resistance values for screen-printed prints obtained with the compositions of INVENTION EXAMPLES 5 to 8 are also given in Table 6 below.

TABLE 6

| | Invention Example nr | | | |
|---|---|---|---|---|
| | 5 | 6 | 7 | 8 |
| mesh | P79 | P79 | P79 | P79 |
| Surface resistance [Ω/square] | 783 | 1007 | 1156 | 1154 |
| Optical density | 0.08 | 0.08 | 0.08 | 0.08 |
| Haze | 3.94 | 5.88 | 7.26 | 8.28 |

These experiments repeat those of INVENTION EXAMPLES 1 to 4 with very similar results regarding surface resistance and viscosity, but far superior results in respect of transparency as shown by the much reduced optical density for identical coating conditions.

Invention Examples 9 to 14

INVENTION EXAMPLES 9 to 14 investigated the effect of variations in the preparation procedure of the composition of INVENTION EXAMPLE 8 on the properties of the resulting compositions and in particular the effect of separate addition of the monomers and the initiator and warming the PEDOT paste 02 during preparation of 300 g batches of the composition on the one hand and the effect of preheating the premixed monomer and initiator and warming the PEDOT paste 02 during the preparation of 900 g batches of the composition on the other.

First 3-glycidoxypropyltrimethoxy-silane, Zonyl® FSO100 and ethanol were added to PEDOT paste 02 as follows: the 3-glycidoxypropyltrimethoxy-silane was added to PEDOT paste 02 while stirring at 3000 rpm, then after waiting 5 minutes with stirring the Zonyl® FSO100 was added with stirring, then after waiting 60 minutes the ethanol was added slowly with stirring to give the starting material for preparing the compositions of INVENTION EXAMPLES 9 to 14.

The addition of the monomers and initiator to prepare the compositions of INVENTION EXAMPLES 9 to 14 are summarized in Table 7 below. In all cases the compositions were mixed for 1 hour at 11000 rpm after addition of the ingredients.

TABLE 7

| Invention Example nr | Batch size [g] | Temperature of starting material [° C.] | Addition of monomer 6 | Addition of monomer 7 | Addition of Initiator 52 | Temperature of premixed solution [° C.] |
|---|---|---|---|---|---|---|
| 9 | 300 | 25 | first | second | third | — |
| 10 | 300 | 40 | first | second | third | — |
| 11 | 300 | 60 | first | second | third | — |
| 12 | 900 | 40 | together as premixed solution | | | 25 |
| 13 | 900 | 40 | together as premixed solution | | | 40 |
| 14 | 900 | 40 | together as premixed solution | | | 60 |

The viscosities of the resulting screen printing ink were determined at 25° C. using a Brookfield DVII+PRO cone and plate viscometer at a shear rate of 0.1 s$^{-1}$ at different times (minutes) from the start of the viscosity measurement. The compositions and viscosities of the compositions of INVENTION EXAMPLES 9 to 14 are given in Table 8 below.

The compositions of INVENTION EXAMPLES 9 to 14 were screen-printed at 300 mm/s with a 79 mesh on support 02, then dried for 3 minutes at 130° C. before curing by passing twice through an AKTIPRINT T UV table dryer from Technigraf GmbH at a throughput of 20 m/min at 100% UV lamp power.

The optical densities of the prints together with the support were measured in transmission with a MacBeth TR924 densitometer with a visible filter are given in Table 7 below for screen-printed prints obtained with the compositions of INVENTION EXAMPLES 9 to 14.

The haze of the prints was determined with a Haze-gard plus apparatus from BYK Gardner according to ASTM D1003 and is also given in Table 6 below for the INVENTION EXAMPLES 9 to 14.

The surface resistances at room temperature were determined by contacting the outermost layer with parallel electrodes each 45 mm long and 45 mm apart capable of forming line contacts with copper electrodes via silver-filled rubber, the electrodes being separated by a teflon insulator. This enables a direct measurement of the surface resistance to be realized. The surface resistance values for screen-printed prints obtained with the compositions of INVENTION EXAMPLES 9 to 14 are also given in Table 8 below.

TABLE 8

| Invention Example nr | | Viscosity at 0.1 s$^{-1}$ & 25° C. [Pas] | mesh size | Optical density + PET | Surface resistance [Ω/square] | Haze |
|---|---|---|---|---|---|---|
| 8 | after 1 min | 30.33 | P79 | 0.08 | 976 | 6.65 |
|   | after 2 min | 27.26 | P79 |      | 1045 | 6.61 |
|   | after 10 min | 23.58 | P79 |     | 981 | 6.63 |
| 9 | after 1 min | 1.23 | P79 | 0.08 | 889 | 10.2 |
|   | after 2 min | 1.47 | P79 |      | 908 | 10.3 |
|   | after 10 min | 2.33 | P79 |     | 793 | 10.25 |
| 10 | after 1 min | 31.07 | P79 | 0.08 | 897 | 7.65 |
|    | after 2 min | 30.09 | P79 |     | 927 | 7.53 |
|    | after 10 min | 10.31 | P79 |    | 932 | 7.59 |
| 11 | after 1 min | 18.30 | P79 | 0.08 | 980 | 9.13 |
|    | after 2 min | 12.89 | P79 |     | 973 | 9.1 |
|    | after 10 min | 3.31 | P79 |     | 951 | 9.12 |
| 12 | after 1 min | 20.26 | P79 | 0.08 | 920 | 8.13 |
|    | after 2 min | 20.14 | P79 |     | 903 | 8.15 |
|    | after 10 min | 20.51 | P79 |    | 879 | 8.14 |
| 13 | after 1 min | 21.49 | P79 | 0.08 | 860 | 8.13 |
|    | after 2 min | 20.88 | P79 |     | 826 | 8.93 |
|    | after 10 min | 2.82 | P79 |     | 879 | 8.53 |
| 14 | after 1 min | 25.67 | P79 | 0.08 | 941 | 7.86 |
|    | after 2 min | 14.12 | P79 |     | 910 | 8.02 |
|    | after 10 min | 1.96 | P79 |     | 873 | 7.94 |

There is little variation in surface resistance, optical density and curing performance. The prints with the compositions of INVENTION EXAMPLES 8, 9 and 12 showed some particles in the prints. The viscosities for the compositions of INVENTION EXAMPLES 11, 13 and 14 with a starting temperature of 60° C. and premixed temperatures of 40 and 60° C. respectively decreased dramatically with time after the start of the viscosity measurement meaning that such compositions could not be screen printed. Moreover, the viscosity for the composition of INVENTION EXAMPLE 9 although fairly stable was much too low for screen printing. The compositions of INVENTION EXAMPLES 8 and 12 exhibited fairly stable viscosities with time from the start of the viscosity measurement.

Invention Examples 15 to 22

INVENTION EXAMPLES 15 to 22 investigated the reproducibility and effect of scaling up of the preparation process of INVENTION EXAMPLE 8 on the properties of the resulting compositions. The preparation was carried out as described for INVENTION 8 except that the 300 g batches were stirred at 1000 rpm and the 5000 g batches were stirred at 1500 rpm. The evaluation of the resulting compositions was carried out as described in INVENTION EXAMPLES 8 to 14 except that the curing involved three passes through the AKTIPRINT T UV table dryer instead of two with a curing energy of 0.86 J cm$^{-2}$ per pass. Table 9 summarises the viscosities at different times from the start of the viscosity measurement for the compositions of INVENTION EXAMPLES 15 to 22 after standing for 24 hours after preparation of the compositions and the optical densities, surface resistances and haze of prints produced upon screen-printing the compositions of INVENTION EXAMPLES 15 to 22 through a P79 mesh also 24 hours after the preparation of the compositions.

TABLE 9

| Invention Example nr | Batch size [g] | | Viscosity at 0.1 s$^{-1}$ & 25° C. [Pas] | mesh size | Optical density + PET | SR# [Ω/square] | haze |
|---|---|---|---|---|---|---|---|
| 15 | 300 | after 1 min | 30.33 | P79 | 0.08 | 922 | 7.84 |
|    |     | after 2 min | 27.26 |     |      |     |      |
|    |     | after 3 min | 23.58 |     |      |     |      |
| 16 | 300 | after 1 min | 38.21 | P79 | 0.08 | 851 | 8.98 |
|    |     | after 2 min | 37.21 | P79 |      | 857 |      |
|    |     | after 3 min | 32.17 |     |      |     |      |
| 17 | 300 | after 1 min | 27.88 | P79 | 0.08 | 898 | 8.48 |
|    |     | after 2 min | 28.37 | P79 |      | 901 |      |
|    |     | after 3 min | 26.52 |     |      |     |      |
| 18 | 5000 | after 1 min | 25.42 | P79 | 0.08 | 890 | 6.96 |
|    |      | after 2 min | 24.68 | P79 |     | 895 |      |
|    |      | after 3 min | 22.47 |     |      |     |      |
| 19 | 5000 | after 1 min | 30.88 | P79 | 0.08 | 1054 |     |
|    |      | after 2 min | 30.33 |     |      |      |     |
|    |      | after 3 min | 27.51 |     |      |      |     |
| 20 | 5000 | after 1 min | 25.79 | P79 | 0.08 | 897 |     |
|    |      | after 2 min | 25.42 | P79 |     | 881 |     |
|    |      | after 3 min | 23.21 |     |      |     |     |
| 21 | 5000 | after 1 min | 18.79 | P79 | 0.08 | 945 |     |
|    |      | after 2 min | 17.93 | P79 |     | 952 |     |
|    |      | after 10 min | 17.07 |    |     |     |     |
| 22 | 5000 | after 1 min | 29.10 |     |     |     |     |
|    |      | after 2 min | 28.73 |     |     |     |     |
|    |      | after 10 min | 24.56 |    |     |     |     |

SR = Surface resistance

The viscosity of the composition of INVENTION EXAMPLE 20 increased to 39010 mPas over 3 months in a refrigerator. No precipitation was observed upon lamination and all the prints exhibited little or no mottle and exhibited excellent adhesion to support 02, according to a tape test. In general the stability of the viscosity with time after the start of the viscosity measurement and the reproducibility of the properties of the compositions of INVENTION EXAMPLES 15 to 22 were excellent. In all cases a reduction in viscosity was observed during the viscosity measurements.

Invention Examples 23 to 31

The compositions of INVENTION EXAMPLES 23 to 31 were prepared using PEDOT paste 02 as follows with the quantities given in Table 8 below: the 3-glycidoxypropyltri-methoxy-silane was added to PEDOT paste 02 while stirring at 1000 rpm, then after waiting 5 minutes with stirring the Zonyl® FSO100 was added with stirring, then after waiting 60 minutes the ethanol was added slowly with stirring, a further 5 minutes was waited with stirring before adding a premixed mixture of INITIATOR 52 and the MONOMERS given in Table 10 with stirring for 60 minutes to produce the final composition.

The optical densities of the prints together with the support were measured in transmission with a MacBeth TR924 densitometer with a visible filter are given in Table 11 below for screen-printed prints obtained with the compositions of INVENTION EXAMPLES 23 to 31.

The haze of the prints was determined with a Haze-gard plus apparatus from BYK Gardner according to ASTM D1003 and is also given in Table 11 below for the compositions of INVENTION EXAMPLES 23 to 31.

TABLE 10

| | Invention Example nr. | | | | | | | | |
|---|---|---|---|---|---|---|---|---|---|
| | 23 | 24 | 25 | 26 | 27 | 28 | 29 | 30 | 31 |
| INITIATOR 52 [g] | 0.297 | 0.594 | 0.792 | 0.792 | 0.792 | 0.792 | 0.792 | 0.792 | 0.792 |
| MONOMER 1 [g] | — | — | — | — | — | 7.128 | — | — | — |
| MONOMER 2 [g] | — | — | — | — | — | — | 7.128 | — | — |
| MONOMER 6 [g] | 5.72 | 5.72 | 7.128 | — | — | — | — | — | — |
| MONOMER 7 [g] | 0.594 | — | 0.792 | 0.792 | 0.792 | 0.792 | 0.792 | 0.792 | 0.792 |
| MONOMER 8 [g] | — | — | — | 7.128 | — | — | — | — | — |
| MONOMER 9 [g] | — | — | — | — | 7.128 | — | — | — | — |
| MONOMER 19 [g] | — | — | — | — | — | — | — | 7.128 | — |
| MONOMER 20 [g] | — | — | — | — | — | — | — | — | 7.128 |
| 3-glycidoxy-propyltri-methoxy-silane [g] | 0.80 | 0.80 | 1.07 | 1.07 | 1.07 | 1.07 | 1.07 | 1.07 | 1.07 |
| Zonyl ® FSO100 [g] | 0.40 | 0.40 | 0.53 | 0.53 | 0.53 | 0.53 | 0.53 | 0.53 | 0.53 |
| Ethanol [g] | 3.22 | 3.22 | 4.29 | 4.29 | 4.29 | 4.29 | 4.29 | 4.29 | 4.29 |
| PEDOT paste 02 [g] | 135.7 | 135.7 | 180.9 | 180.9 | 180.9 | 180.9 | 180.9 | 180.9 | 180.9 |
| Viscosity at 25° C. & 0.1 s$^{-1}$ shear after 10 min [Pas] | 28.00 | 26.52 | 26.52 | 21.24 | 21.61 | 21.37 | 19.16 | 11.67 | 15.47 |

The viscosities of the resulting screen printing ink were determined at 25° C. using a Brookfield DVII+PRO cone and plate viscometer at a shear rate of 0.1 s$^{-1}$ after 10 minutes and are also given in Table 8. The compositions of INVENTION EXAMPLES 23 to 31 were screen-printed at 300 mm/s with a 79 mesh on support 02, then dried for 3 minutes at 130° C. before curing by passing 5 times for the composition of INVENTION EXAMPLE 23, once for the composition of INVENTION EXAMPLE 24 and 3 times for the compositions of INVENTION EXAMPLES 25 to 31 through an AKTIPRINT T UV-table-dryer from Technigraf GmbH at a throughput of 20 m/min at 100% UV lamp power.

The surface resistances at room temperature were determined by contacting the outermost layer with parallel electrodes each 45 mm long and 45 mm apart capable of forming line contacts with copper electrodes via silver-filled rubber, the electrodes being separated by a teflon insulator. This enables a direct measurement of the surface resistance to be realized. The surface resistance values for screen-printed prints obtained with the compositions of INVENTION EXAMPLES 23 to 31 are also given in Table 11 below.

TABLE 11

| | Invention Example nr | | | | | | | | |
|---|---|---|---|---|---|---|---|---|---|
| | 23 | 24 | 25 | 26 | 27 | 28 | 29 | 30 | 31 |
| mesh | P79 | P79 | P79 | P79 | P79 | P79 | P79 | P79 | P79 |
| Surface resistance [Ω/square] | 1710 | 980 | 898 | 870 | 880 | 930 | 940 | 1530 | 1410 |
| Optical density | 0.08 | 0.08 | 0.08 | 0.08 | 0.08 | 0.07 | 0.08 | 0.08 | 0.08 |
| Haze | — | — | 8.48 | 7.02 | 5.28 | 3.29 | 4.76 | 10.63 | 9.88 |

All these alternative monomer combinations give comparable surface resistances often coupled with significantly reduced haze.

Invention Examples 32 and 33

The compositions of INVENTION EXAMPLES 32 to 33 were prepared using PEDOT paste 02 as follows with the quantities given in Table 12 below: the 3-glycidoxypropyltrimethoxy-silane was added to PEDOT paste 02 while stirring at 1000 rpm, then after waiting 5 minutes with stirring the Zonyl® FSO100 was added with stirring, then after waiting 60 minutes the ethanol was added slowly with stirring, a further 5 minutes was waited with stirring before adding a premixed mixture of the INITIATOR given in Table 10, MONOMER 6 and MONOMER 7 with stirring for 60 minutes to produce the final composition. The viscosities of the resulting screen printing ink were determined at 25° C. using a Brookfield DVII+PRO cone and plate viscometer at a shear rate of 0.1 $s^{-1}$ after 10 min. The compositions and viscosities of the compositions of INVENTION EXAMPLES 32 and 33 together with that of INVENTION EXAMPLE 25 for comparison purposes are given in Table 12 below:

TABLE 12

| | Invention Example nr. | | |
|---|---|---|---|
| | 25 | 32 | 33 |
| INITIATOR 16 [g] | — | — | 0.792 |
| INITIATOR 52 [g] | 0.792 | — | — |
| INITIATOR 64 [g] | — | 0.792 | — |
| MONOMER 6 [g] | 7.128 | 7.128 | 7.128 |
| MONOMER 7 [g] | 0.792 | 0.792 | 0.792 |
| MONOMER 8 [g] | — | — | — |
| 3-glycidoxypropyltrimethoxysilane [g] | 1.07 | 1.07 | 1.07 |
| Zonyl® FSO100 [g] | 0.53 | 0.53 | 0.53 |
| Ethanol [g] | 4.29 | 4.29 | 4.29 |
| PEDOT paste 02 [g] | 180.91 | 180.91 | 180.91 |
| viscosity at 25° C. & 0.1 $s^{-1}$ shear after 10 min [Pas] | 26.52 | 15.60 | 14.98 |

The compositions of INVENTION EXAMPLES 32 and 33 were screen-printed at 300 mm/s with a 79 mesh on support 02, then dried for 3 minutes at 130° C. before curing by passing 5 times through an AKTIPRINT T UV table dryer from Technigraf GmbH at a throughput of 20 m/min at 100% UV lamp power.

The optical densities of the prints together with the support were measured in transmission with a MacBeth TR924 densitometer with a visible filter are given in Table 13 below for screen-printed prints obtained with the compositions of INVENTION EXAMPLES 32 and 33 with that for the composition of INVENTION EXAMPLE 25 for comparison purposes.

The haze of the prints was determined with a Haze-gard plus apparatus from BYK Gardner according to ASTM D1003 and is also given in Table 13 below for the compositions of INVENTION EXAMPLES 32 and 33 with that for the composition of INVENTION EXAMPLE 25 for comparison purposes.

The surface resistances at room temperature were determined by contacting the outermost layer with parallel electrodes each 45 mm long and 45 mm apart capable of forming line contacts with copper electrodes via silver-filled rubber, the electrodes being separated by a teflon insulator. This enables a direct measurement of the surface resistance to be realized. The surface resistance values for screen-printed prints obtained with the compositions of INVENTION EXAMPLES 32 and 33 with that for the composition of INVENTION EXAMPLE 25 for comparison purposes are also given in Table 13.

TABLE 13

| | Invention Example nr | | |
|---|---|---|---|
| | 25 | 32 | 33 |
| mesh | P79 | P79 | P79 |
| Surface resistance [Ω/square] | 898 | 2010 | 2100 |
| Optical density | 0.08 | 0.08 | 0.08 |
| Haze | 8.98 | 5.32 | 5.90 |

The haze is significantly lower using INITIATORS 16 and 64 instead of INITIATOR 52. Although significantly more energy is required to harden the screen-printed prints with the compositions of INVENTION EXAMPLES 32 and 33, a UV-source with a more suitable UV-emission spectrum will reduce the curing energy required and the lengthy curing may well have had a deleterious effect on the surface resistances observed, which although significantly higher than those with the coating of INVENTION EXAMPLE 25 are not prohibitively higher particularly for applications in which the reduced haze would be advantageous.

Invention Examples 34 to 43

The compositions of INVENTION EXAMPLES 34 to 43 were prepared using different lots of PEDOT paste 02 in the following standard composition as described for INVENTION EXAMPLE 25, see Table 14. The viscosities of the resulting screen printing ink were determined at 25° C. using a Brookfield DVII+PRO cone and plate viscometer at a shear rate of 0.2 $s^{-1}$ after 10 minutes.

TABLE 14

| Invention Example nr. | INITIATOR 52 [g] | MONOMER 6 [g] | MONOMER 7 [g] | 3-glycidoxypropyl-trimethoxysilane [g] | Zonyl® FSO100 [g] | $C_2H_5OH$ [g] | PEDOT paste 02 lot | wt. [g] | viscosity at 25° C. & shear rate of 0.2 $s^{-1}$ [Pas] after 1 min | after 10 min |
|---|---|---|---|---|---|---|---|---|---|---|
| 25 | 1.09 | 9.83 | 1.09 | 1.38 | 0.69 | 5.52 | A | 250 | | 26.52 |
| 34 | 1.09 | 9.83 | 1.09 | 1.38 | 0.69 | 5.52 | B | 250 | | 22.47 |
| 35 | 1.09 | 9.83 | 1.09 | 1.38 | 0.69 | 5.52 | C | 250 | | 21.37 |
| 36 | 1.09 | 9.83 | 1.09 | 1.38 | 0.69 | 5.52 | D | 250 | | 15.47 |
| 37 | 1.09 | 9.83 | 1.09 | 1.38 | 0.69 | 5.52 | E | 250 | | 20.02 |
| 38 | 1.09 | 9.83 | 1.09 | 1.38 | 0.69 | 5.52 | E | 250 | | 7.61 |
| 39 | 1.09 | 9.83 | 1.09 | 1.38 | 0.69 | 5.52 | F | 250 | | 27.51 |
| 40* | 1.09 | 9.83 | 1.09 | 1.38 | 0.69 | 5.52 | F | 250 | 25.66 | 25.30 |
| 41* | 1.09 | 9.83 | 1.09 | 1.38 | 0.69 | 5.52 | G | 250 | 24.44 | 27.38 |

TABLE 14-continued

| Invention Example nr. | INITIATOR 52 [g] | MONOMER 6 [g] | MONOMER 7 [g] | 3-glycidoxypropyl-trimethoxysilane [g] | Zonyl® FSO100 [g] | $C_2H_5OH$ [g] | PEDOT paste 02 lot | PEDOT paste 02 wt. [g] | viscosity at 25° C. & shear rate of 0.2 $s^{-1}$ [Pas] after 1 min | viscosity at 25° C. & shear rate of 0.2 $s^{-1}$ [Pas] after 10 min |
|---|---|---|---|---|---|---|---|---|---|---|
| 42* | 1.09 | 9.83 | 1.09 | 1.38 | 0.69 | 5.52 | H | 250 | 19.89 | 22.84 |
| 43* | 1.09 | 9.83 | 1.09 | 1.38 | 0.69 | 5.52 | I | 250 | 16.82 | 18.54 |

*mixed at 11000 rpm

The compositions of INVENTION EXAMPLES 34 to 40 were screen-printed at 300 mm/s with a 79 mesh on support 02, then dried for 3 minutes at 130° C. before in the cases of INVENTION EXAMPLES 25, 34 and 36 to 43 curing by passing once through an AKTIPRINT T UV table dryer from Technigraf GmbH at a throughput of 20 m/min at 100% UV lamp power. The composition of INVENTION EXAMPLE 35 was cured by passing 3 times at 20 m/min through a model DRSE-120 Conveyor from Fusion Systems Ltd. with a D-bulb UV-lamp, having a power of 6000 W, an emission in the 200-400 nm range and an effective exposure length of 27 cm.

The optical densities of the prints together with the support were measured in transmission with a MacBeth TR924 densitometer with a visible filter are given in Table 15 below for screen-printed prints obtained with the compositions of INVENTION EXAMPLES 34 to 43 and INVENTION EXAMPLE 25.

The haze of the prints was determined with a Haze-gard plus apparatus from BYK Gardner according to ASTM D1003 and is an average of 6 measurements consisting of 3 measurements carried out on each of two prints. The haze measurements are also given in Table 15 for the compositions of INVENTION EXAMPLES 25 and 34 to 43.

The surface resistances at room temperature were determined by contacting the outermost layer with parallel electrodes each 45 mm long and 45 mm apart capable of forming line contacts with copper electrodes via silver-filled rubber, the electrodes being separated by a teflon insulator. This enables a direct measurement of the surface resistance to be realized. The surface resistance values for screen-printed prints obtained with the compositions of INVENTION EXAMPLES 25 and 34 to 43 are also given in Table 15.

Although different lots of PEDOT paste 02 gave screen-printing inks which were all easy to cure and whose prints had for the most part very similar low surface resistances, the haze of the print is apparently strongly dependent upon the particular lot of PEDOT paste 02 used to prepare the screen-printing ink used. Moreover, further stirring of the screen-printing ink of INVENTION EXAMPLE 36 at high shear (11000 rpm) had no effect on the haze of the printed layers.

It was noticed that if TESA 4122 tape from BEIERSDORF was applied to the prints the haze disappeared indicating that it was entirely due to surface roughness-induced interference effects. Moreover, whereas such surface haze may be critical for some applications, it does not adversely affect the light output of light emitting devices based on inorganic phosphors nor does it affect the uniformity of the light output.

Invention Examples 44 to 47

The results for the screen-printing inks of INVENTION EXAMPLES 37 and 38 for lot E and INVENTION EXAMPLES 39 and 40 for lot F showed that for same lot of PEDOT paste 02 screen-printing inks could be obtained with both high and low hazes.

The origin of the haze was investigated by omitting one of the ingredients from each formulation in turn and diluting the PEDOT paste 02 with the same mixture of 1,2-propanediol, diethylene glycol and water. Of the prints made with these formulations only that without MONOMER 6 exhibited a low haze. These observations suggest that the haze results from an interference between MONOMER 6 and the PEDOT/PSS, which could be due to an interaction between the polar ethyleneoxy-groups of MONOMER 6 and the highly polar PEDOT. This effect could be minimized by optimizing the

TABLE 15

| | Invention Example nr | | | | | | | | | | |
|---|---|---|---|---|---|---|---|---|---|---|---|
| | 25 | 34 | 35 | 36 | 37 | 38 | 39 | 40 | 41 | 42 | 43 |
| Lot of PEDOT paste 02 | A | B | C | D | E | E | F | F | G | H | I |
| mesh | P79 | P79 | P79 | P79 | P79 | P79 | P79 | P79 | P79 | P79 | P79 |
| Surface resistance [Ω/square] | 898 | 890 | 653 | 1010 | 1286 | 1225 | 931 | 599 | 827 | 730 | 1149 |
| Optical density | 0.08 | | | | | | | | | | |
| Haze | 8.98 | 7.84 | 7.21 | 61.0 | 59.5 | 11.5 | 60.2 | 14.9 | 15.1 | 18.9 | 40.9 |
| viscosity at 25° C. & shear rate of 0.2 $s^{-1}$ after 10 min [Pas] | 26.52 | 22.47 | 21.37 | 15.47 | 20.02 | 7.61 | 27.51 | 25.30 | 27.38 | 22.84 | 18.54 | degree of mixing by increasing the shear rate during mixing e.g. by mixing at a shear rate of 11000 rpm prints with high haze could be avoided. However, such high shear rates resulted in a significant increase in the temperature of the composition, which could adversely affect the properties of the screen-printing ink produced.

Experiments were therefore carried out to establish the effect of temperature on the performance of the screen-printing inks produced. The screen printing inks of INVENTION EXAMPLES 44 to 47 were prepared according to the standard formula of the screen-printing inks of INVENTION EXAMPLES 25 and 34 to 43 using PEDOT paste 02 lot F and the standard preparation procedure but at temperatures of 20, 25, 30 and 40° C. respectively using a mixing speed of 11000 rpm.

The compositions of INVENTION EXAMPLES 44 to 47 were screen-printed at 300 mm/s with a 79 mesh on support 02 and then dried for 10 minutes at 90° C. before curing by passing once through an AKTIPRINT T UV table dryer from Technigraf GmbH at a throughput of 20 m/min at 100% UV lamp power.

The optical densities of the prints together with the support, the haze of the prints and the surface resistances for prints obtained with the compositions of INVENTION EXAMPLES 44 to 48 and evaluated as described for INVENTION EXAMPLES 25 and 34 to 43 are given in Table 16 below.

The homogeneity assessment is a measure of marks related to the drying process, which are observed as a grid structure corresponding to the metal grid in the transport belt with which the prints are transported through the dryer. Haze measurements according to ASTM D1003 are measured over a too large surface area to be able to adequately reflect the variations in haze due to drying marks. As a result a visual inspection test was developed in which an assessment of 0 corresponds to no grid structure being visible in reflection and an assessment of 5 corresponds to a pronounced grid structure visible in transmission:

| Homogeneity assessment | characteristics |
| --- | --- |
| 0 = | no grid structure visible in reflection |
| 1 = | extremely faint grid structure visible in reflection only upon extensive examination |
| 2 = | faint grid structure visible in reflection without extensive examination |
| 3 = | grid structure clearly visible in reflection |
| 4 = | weak grid structure visible in transmission |
| 5 = | pronounced grid structure visible in transmission |

If more than one print is involved in the inspection process an average value of the homogeneity assessments of each print is given. The homogeneity assessment values are also given in Table 16.

The results in Table 16 show that the use of lower mixing temperatures reduces the haze exhibited by the prints due to the increase in mixing shear as a result of the higher composition viscosities.

TABLE 16

|  | Invention Example nr | | | | |
| --- | --- | --- | --- | --- | --- |
|  | 44 | 45 | 46 | 47 | 48 |
| Lot of PEDOT paste 02 used | F | F | F | F | F |
| Mixing temperature [° C.] | 20 | 20 | 25 | 30 | 40 |

TABLE 16-continued

|  | Invention Example nr | | | | |
| --- | --- | --- | --- | --- | --- |
|  | 44 | 45 | 46 | 47 | 48 |
| Stirring speed [rpm] | 11000 | 11000 | 11000 | 11000 | 11000 |
| viscosity at 25° C. & shear rate of 0.2 s$^{-1}$ after 1 min [Pas] | 46.91 | 47.77 | 46.54 | 42.00 | 18.67 |
| viscosity at 25° C. & shear rate of 0.2 s$^{-1}$ after 10 min [Pas] | 40.77 | 41.51 | 43.35 | 36.35 | 25.67 |
| mesh | P79 | P79 | P79 | P79 | P79 |
| Surface resistance [Ω/square] | 771 | 696 | 735 | 723 | 771 |
| Optical density | 0.100 | 0.100 | 0.101 | 0.103 | 0.105 |
| Haze | 8.61 | 8.44 | 10.64 | 10.46 | 21.91 |
| Homogeneity assessment | 0.2 | 0.2 | 0.4 | 0.4 | 0.7 |

Experiments were then carried out to establish the optimum stirring speed for preparing the standard composition of INVENTION EXAMPLE 25 and 34 to 43. The screen printing inks of INVENTION EXAMPLES 49 to 51 were prepared according to the standard formula using PEDOT paste 02 lot F and the standard preparation procedure at a temperatures of 30° C. respectively and mixing speeds of 11000, 6000, 4000 and 3000 rpm respectively.

The compositions of INVENTION EXAMPLES 49 to 51 were screen-printed at 300 mm/s with a 79 mesh on support 02 and then dried for 10 minutes at 90° C. before curing by passing once through an AKTIPRINT T UV table dryer from Technigraf GmbH at a throughput of 20 m/min at 100% UV lamp power. The average haze values, the average homogeneity assessment and the surface resistance values obtained with the compositions of INVENTION EXAMPLES 47 and 49 to 51 are summarized in Table 17.

TABLE 17

|  | Invention Example nr | | | |
| --- | --- | --- | --- | --- |
|  | 47 | 49 | 50 | 51 |
| Lot of PEDOT paste 02 used | F | F | F | F |
| Mixing temperature [° C.] | 30 | 30 | 30 | 30 |
| Stirring speed [rpm] | 11000 | 6000 | 4000 | 3000 |
| viscosity at 25° C. & shear rate of 0.2 s$^{-1}$ after 1 min [Pas] | 42.00 | 41.14 | 33.03 | 24.44 |
| viscosity at 25° C. & shear rate of 0.2 s$^{-1}$ after 10 min [Pas] | 36.35 | 37.58 | 35.37 | 31.93 |
| mesh | P79 | P79 | P79 | P79 |
| Surface resistance [Ω/square] | 723 | 798 | 790 | 838 |
| Optical density | 0.103 | 0.107 | 0.110 | 0.107 |
| Haze | 10.46 | 17.61 | 25.79 | 35.31 |
| Homogeneity assessment | 0.4 | 0.8 | 0.8 | 1 |

The stirring speed has no influence upon the optical density of the prints. Increasing the stirring speed sharply reduces the average haze, doubling of the stirring speed reducing the haze value by a factor of two. The surface resistance was reduced and the homogeneity of the layer was also improved upon increasing the mixing shear by increasing the stirring speed.

Finally the influence of the viscosity of the lot of PEDOT paste 02 upon the print properties was investigated. Three additional PEDOT paste 02 lots were used in addition to lot F:

lot J with a viscosity at 25° C. and 0.2 s$^{-1}$ shear of 48.63 Pas (after 10 minutes);

lot F with a viscosity at 25° C. and 0.2 s$^{-1}$ shear of 37.58 Pas (after 10 minutes);

lot K with a viscosity at 25° C. and 0.2 s$^{-1}$ shear of 28.37 Pas (after 10 minutes);

lot L with a viscosity at 25° C. and 0.2 s$^{-1}$ shear of 20.76 Pas (after 10 minutes).

The screen printing inks of INVENTION EXAMPLES 52 to 54 were prepared according to the standard formula of the compositions of INVENTION EXAMPLES 25 and 34 to 50 using PEDOT paste 02 lots J, K, and L respectively and the standard preparation procedure at a temperature of 30° C. respectively and a mixing speed of 11000 rpm.

The compositions of INVENTION EXAMPLES 52 to 54 were screen-printed at 300 mm/s with a 79 mesh on support 02 and then dried for 10 minutes at 90° C. before curing by passing once through an AKTIPRINT T UV table dryer from Technigraf GmbH at a throughput of 20 m/min at 100% UV lamp power. The average haze values, the average homogeneity assessment values and the surface resistance values obtained with the compositions of INVENTION EXAMPLES 47 and 52 to 54 are summarized in Table 18.

TABLE 18

|  | Invention Example nr | | | |
|---|---|---|---|---|
|  | 52 | 47 | 53 | 54 |
| Lot of PEDOT paste 02 used | J | F | K | L |
| Mixing temperature [° C.] | 30 | 30 | 30 | 30 |
| Stirring speed [rpm] | 11000 | 11000 | 11000 | 11000 |
| viscosity at 25° C. & shear rate of 0.2 s$^{-1}$ after 2 min [Pas] | 42.24 | 44.09 | 27.38 | 19.28 |
| viscosity at 25° C. & shear rate of 0.2 s$^{-1}$ after 10 min [Pas] | 36.10 | 36.35 | 26.65 | 19.77 |
| mesh | P79 | P79 | P79 | P79 |
| Surface resistance [Ω/square] | 762 | 723 | 799 | 883 |
| Optical density | 0.106 | 0.103 | 0.101 | 0.105 |
| Haze | 12.86 | 10.46 | 17.59 | 26.59 |
| Homogeneity assessment | 1 | 0.4 | 1.5 | 3 |

The results in Table 18 show that below a PEDOT paste 02 viscosity at 25° C. and a shear of 0.2 s$^{-1}$ after 10 min of 35 Pas, the haze and the homogeneity were directly influenced by the viscosity of the PEDOT paste 02 used.

Invention Examples 55 to 94

A systematic evaluation was carried out with the screen-printing inks of INVENTION EXAMPLES 40 to 43 of the drying marks observed in prints dried under different drying conditions. The prints of INVENTION EXAMPLES 55 to 61 were prepared with the screen printing ink of INVENTION EXAMPLE 40 using different drying conditions followed by curing by passing once through an AKTIPRINT T UV table dryer from Technigraf GmbH at a throughput of 20 m/min at 100% UV lamp power. The drying conditions, haze and surface resistance of the resulting prints are given in Table 19 below.

TABLE 19

| Invention Example nr | Drying temperature [° C.] | Drying time [min] | Haze average | Haze standard deviation | homogeneity assessment | Surface resistance [Ω/square] |
|---|---|---|---|---|---|---|
| 55 | 90 | 10 | 11.36 | 0.055 |  | 570 |
| 56 | 110 | 3 | 13.64 | 0.13 |  | 595 |
| 57 | 110 | 10 | 12.08 | 0.08 |  | 598 |
| 58 | 130 | 3 | 14.86 | 0.22 | 5 | 599 |
| 59 | 130 | 10 | 13.56 | 0.21 | 5 | 634 |

TABLE 19-continued

| Invention Example nr | Drying temperature [° C.] | Drying time [min] | Haze average | Haze standard deviation | homogeneity assessment | Surface resistance [Ω/square] |
|---|---|---|---|---|---|---|
| 60 | 150 | 3 | 16.40 | 0.32 | 5 | 623 |
| 61 | 150 | 10 | 10.04 | 0.30 | 5 | 1083 |

The prints of INVENTION EXAMPLES 62 to 68 were prepared with the screen printing ink of INVENTION EXAMPLE 41 using different drying conditions followed curing by passing once through an AKTIPRINT T UV table dryer from Technigraf GmbH at a throughput of 20 m/min at 100% UV lamp power. The drying conditions, haze and surface resistance of the resulting prints are given in Table 20 below.

TABLE 20

| Invention Example nr | Drying temperature [° C.] | Drying time [min] | Haze average | Haze standard deviation | Surface resistance [Ω/square] |
|---|---|---|---|---|---|
| 62 | 90 | 10 | 11.22 | 0.045 | 820 |
| 63 | 110 | 3 | 13.70 | 0.158 | 823 |
| 64 | 110 | 10 | 12.28 | 0.130 | 836 |
| 65 | 130 | 3 | 15.14 | 0.195 | 827 |
| 66 | 130 | 10 | 13.52 | 0.130 | 937 |
| 67 | 150 | 3 | 16.14 | 0.270 | 624 |
| 68 | 150 | 10 | 10.14 | 0.160 | 2988 |

The prints of INVENTION EXAMPLES 69 to 75 were prepared with the screen printing ink of INVENTION EXAMPLE 42 using different drying conditions followed curing by passing once through an AKTIPRINT T UV table dryer from Technigraf GmbH at a throughput of 20 m/min at 100% UV lamp power. The drying conditions, haze and surface resistance of the resulting prints are given in Table 21 below.

TABLE 21

| Invention Example nr | Drying temperature [° C.] | Drying time [min] | Haze average | Haze standard deviation | Surface resistance [Ω/square] |
|---|---|---|---|---|---|
| 69 | 90 | 10 | 14.12 | 0.084 | 692 |
| 70 | 110 | 3 | 16.78 | 0.259 | 722 |
| 71 | 110 | 10 | 15.40 | 0.200 | 719 |
| 72 | 130 | 3 | 18.86 | 0.611 | 730 |
| 73 | 130 | 10 | 16.74 | 0.089 | 763 |
| 74 | 150 | 3 | 19.76 | 0.472 | 754 |
| 75 | 150 | 10 | 15.06 | 1.274 | 1720 |

The prints of INVENTION EXAMPLES 76 to 82 were prepared with the screen printing ink of INVENTION EXAMPLE 43 using different drying conditions followed curing by passing once through an AKTIPRINT T UV table dryer from Technigraf GmbH at a throughput of 20 m/min at 100% UV lamp power. The drying conditions, haze and surface resistance of the resulting prints are given in Table 22 below.

TABLE 22

| Invention Example nr | Drying temperature [° C.] | Drying time [min] | Haze average | Haze standard deviation | Surface resistance [Ω/square] |
|---|---|---|---|---|---|
| 76 | 90 | 10 | 28.74 | 0.089 | 1102 |
| 77 | 110 | 3 | 35.92 | 0.259 | 1135 |
| 78 | 110 | 10 | 32.12 | 0.804 | 1105 |
| 79 | 130 | 3 | 40.86 | 0.279 | 1149 |
| 80 | 130 | 10 | 38.40 | 0.255 | 1198 |
| 81 | 150 | 3 | 44.26 | 0.695 | 1255 |
| 82 | 150 | 10 | 28.74 | 0.416 | 4177 |

These results show that the average haze values were little affected by varying the drying temperature and time, but that the standard deviation of the haze values i.e. the variation of the haze substantially increased upon increasing the drying temperature and shortening the drying time i.e. that this variation is directly due to drying conditions i.e. represents a drying mark. Moreover, these results also show that the variation in haze was more pronounced the higher the average haze value.

The results in Tables 19 to 22 also show that the drying marks could be substantially reduced by reducing the drying temperature and commensurately increasing the drying time. For example a print dried for 3 minutes is almost triply more visible if dried at 150° and doubly more visible if dried at 130° C. than if dried at 110° C.

At extreme drying temperatures e.g. 150° C. the drying conditions were also found to increase the surface resistance.

Further experiments were carried out with the screen-printing ink of INVENTION EXAMPLE 40 to investigate the benefits of drying temperatures of 110° C. or lower. The prints of INVENTION EXAMPLES 83 to 94 were prepared using different drying conditions followed curing by passing once through an AKTIPRINT T UV table dryer from Technigraf GmbH at a throughput of 20 m/min at 100% UV lamp power. The drying conditions, haze, average homogeneity assessment values and surface resistance of the resulting prints are given in Table 23 below.

TABLE 23

| Invention Example nr | Drying temperature [° C.] | Drying time [min] | Haze average | Haze standard deviation | homogeneity assessment | Surface resistance [Ω/square] |
|---|---|---|---|---|---|---|
| 83 | 90 | 3 | | | not dry | |
| 84 | 90 | 5 | | | not dry | |
| 85 | 90 | 7 | 6.60 | — | 2 | 2400 |
| 86 | 90 | 10 | 11.99 | — | 0.5 | 640 |
| 87 | 100 | 3 | | | not dry | |
| 88 | 100 | 5 | 13.26 | — | 0.5 | 710 |
| 89 | 100 | 7 | 12.86 | — | 0.5 | 670 |
| 55 | 100 | 10 | 12.41 | — | 2 | 660 |
| 90 | 110 | 3 | 13.64 | 0.13 | — | 595 |
| 91 | 110 | 3 | 14.79 | — | 1 | 660 |
| 92 | 110 | 5 | 14.41 | — | 2 | 660 |
| 56 | 110 | 7 | 13.44 | — | 2 | 650 |
| 93 | 110 | 10 | 12.08 | 0.08 | — | 598 |
| 94 | 110 | 10 | 12.80 | — | 2 | 670 |

The results in Table 23 show that drying at 90 and 100° C. requires a minimum drying time of 10 and 5 minutes respectively. The high surface resistance for the print of INVENTION EXAMPLE 85 shows the residual presence of 1,2-propanediol. There is no significant effect upon the surface resistance upon increasing the drying temperature and drying time. The prints of INVENTION EXAMPLES 86, 88 and 89 exhibited a homogeneity assessment value of 0.5 i.e. a very good homogeneity with virtually no drying pattern being observable, whereas the print of INVENTION EXAMPLE 59 dried at 130° C. for 10 minutes exhibited a homogeneity assessment value of 5. However, the preferred drying conditions are 90° C. for 10 minutes as less drying spots are generated, although drying at 100° C. for 5 minutes is preferred if time is a deciding parameter.

Invention Examples 95 to 98

The compositions of INVENTION EXAMPLES 95 to 98 were prepared using PEDOT paste 02 lot F using the preparation procedure described for the composition of INVENTION EXAMPLE 25 with the quantities given in Table 24 below. The compositions and viscosities of the compositions of INVENTION EXAMPLES 95 to 98 are given in Table 24 below:

TABLE 24

| | Invention Example nr. | | | |
|---|---|---|---|---|
| | 95 | 96 | 97 | 98 |
| INITIATOR 52 [g] | 1.09 | 1.09 | 1.09 | 1.09 |
| MONOMER 6 [g] | 9.83 | 7.01 | 4.26 | 1.09 |
| MONOMER 7 [g] | 1.09 | 1.09 | 1.09 | 1.09 |
| 3-glycidoxypropyl-trimethoxysilane [g] | 1.38 | 1.38 | 1.38 | 1.38 |
| Zonyl ® FSO100 [g] | 0.69 | 0.69 | 0.69 | 0.69 |
| Ethanol [g] | 5.52 | 5.52 | 5.52 | 5.52 |
| PEDOT paste 02 [g] | 250 | 250 | 250 | 250 |
| weight ratio of monomers to PEDOT/PSS | 5.54 | 4.11 | 2.71 | 1.36 |
| viscosity at 25° C. at a shear rate of 0.2 $s^{-1}$ after 1 min [Pas] | 34.507 | 32.788 | 40.770 | 37.945 |
| viscosity at 25° C. at a shear rate of 0.2 $s^{-1}$ after 10 min [Pas] | 31.928 | 33.033 | 37.577 | 37.331 |

The compositions of INVENTION EXAMPLES 95 to 98 were screen-printed at 300 mm/s with a 79 mesh on support 02, then dried for 10 minutes at 90° C. (condition I) or 3 minutes at 130° C. (condition II) before curing by passing once through an AKTIPRINT T UV table dryer from Technigraf GmbH at a throughput of 20 m/min at 100% UV lamp power.

The optical densities of the prints together with the support, the surface resistances and the haze values determined as described for INVENTION EXAMPLES 25 and 34 to 43 are given in Table 25 below for screen-printed prints obtained with the compositions of INVENTION EXAMPLES 95 to 98.

TABLE 25

| | Invention Example nr | | | | | | | |
|---|---|---|---|---|---|---|---|---|
| | 95 | | 96 | | 97 | | 98 | |
| mesh | P79 | | P79 | | P79 | | P79 | |
| Drying conditions | I* | II# | I* | II# | I* | II# | I* | II# |
| Surface resistance [Ω/square] | 844 | 847 | 802 | 798 | 670 | 698 | 637 | 642 |
| Optical density | 0.096 | 0.097 | 0.096 | 0.097 | 0.100 | 0.099 | 0.102 | 0.100 |
| Haze | 13.60 | 17.80 | 12.16 | 16.21 | 8.68 | 11.01 | 7.23 | 7.86 |

*10 minutes at 90° C.
3 minutes at 130° C.

Reducing the concentration of MONOMER 6 did not influence the optical density or the viscosity, but resulted in a decrease in the haze value and surface resistance. All the prints exhibited good adhesion to support 02 and good water resistance.

Invention Examples 99 and 100 [5553640 New Initiator]

The compositions of INVENTION EXAMPLES 99 and 100 were prepared using PEDOT paste 02 lot F and the oligomeric photoinitiator INITIATOR 61 using the preparation procedure described for the composition of INVENTION EXAMPLE 25 with the ingredients and quantities given in Table 26. The compositions and viscosities of the compositions of INVENTION EXAMPLES 98 and 99 are also given in Table 26 below:

TABLE 26

| | Invention Example nr. | |
|---|---|---|
| | 99 | 100 |
| INITIATOR 61 [g] | 2.73 | 1.64 |
| MONOMER 6 [g] | 9.83 | 9.83 |
| MONOMER 7 [g] | 1.09 | 1.09 |
| 3-glycidoxypropyl-trimethoxysilane [g] | 1.38 | 1.38 |
| Zonyl ® FSO100 [g] | 0.69 | 0.69 |
| Ethanol [g] | 5.52 | 5.52 |
| PEDOT paste 02 [g] | 250 | 250 |
| weight ratio initiator to monomers | 0.25 | 0.15 |
| viscosity at 25° C. at a shear rate of 0.2 s$^{-1}$ after 1 min [Pas] | 32.30 | 30.33 |
| viscosity at 25° C. at a shear rate of 0.2 s$^{-1}$ after 10 min [Pas] | 30.33 | 29.96 |

The compositions of INVENTION EXAMPLES 99 and 100 were screen-printed at 300 mm/s with a 79 mesh on support 02, then dried for 10 minutes at 90° C. (condition I) or 3 minutes at 130° C. (condition II) before curing by passing once and twice respectively through an AKTIPRINT T UV table dryer from Technigraf GmbH at a throughput of 20 m/min at 100% UV lamp power. Hardening was obtained with both drying conditions. However, hardening was not observed if a weight ratio of initiator to monomers of 0.05 or 0.02 was used.

The optical densities of the prints together with the support, the surface resistances, haze values and homogeneity assessment values determined as described for INVENTION EXAMPLES 25 and 34 to 43 are given in Table 27 below for screen-printed prints obtained with the compositions of INVENTION EXAMPLES 99 and 100.

TABLE 27

| | Invention Example nr | | | |
|---|---|---|---|---|
| | 99 | | 100 | |
| mesh | P79 | | P79 | |
| drying conditions | I* | II# | I* | II# |
| Surface resistance [Ω/square] | 949 | 935 | 1082 | 1092 |
| Optical density | 0.084 | 0.087 | 0.088 | 0.089 |
| Haze | 11.90 | 15.49 | 14.37 | 19.64 |
| Homogeneity assessment | 1 | 4 | 2 | 5 |

*10 minutes at 90° C.
3 minutes at 130° C.

With a weight ratio of INITIATOR 61 to monomers of 0.05 two passes through the AKTIPRINT T UV table dryer were required to harden the prints. However, with a weight ratio of INITIATOR 61 to monomers of 0.09 prints were obtained with similar properties to those obtained using INITIATOR 52 at a similar weight ratio to monomers, but without the emissions associated with low molecular weight initiators.

Invention Examples 101 to 105

The compositions of INVENTION EXAMPLES 101 to 105 were prepared using PEDOT paste 02 lot F and alternative monomers using the preparation procedure described for the composition of INVENTION EXAMPLE 25 with the ingredients and quantities given in Table 28. The compositions and viscosities of the compositions of INVENTION EXAMPLES 101 to 105 are also given in Table 28 below:

TABLE 28

| | Invention Example nr. | | | | | | | |
|---|---|---|---|---|---|---|---|---|
| | 101 | 102 | 103 | 104 | 105 | 106 | 107 | 108 |
| INITIATOR 52 [g] | 1.09 | 1.09 | 1.09 | 1.09 | 1.09 | 1.11 | 1.10 | 1.10 |
| MONOMER 1 [g] | — | 9.83 | 9.83 | — | — | 1.66 | 1.10 | 0.55 |
| MONOMER 2 [g] | — | — | — | 9.83 | 9.83 | — | — | — |
| MONOMER 6 [g] | 9.83 | — | — | — | — | — | — | — |
| MONOMER 7 [g] | 1.09 | 1.09 | — | 1.09 | — | 4.99 | 2.76 | 1.64 |
| MONOMER 9 [g] | — | — | 1.09 | — | 1.09 | 4.44 | 7.17 | 8.76 |

TABLE 28-continued

| | Invention Example nr. | | | | | | | |
|---|---|---|---|---|---|---|---|---|
| | 101 | 102 | 103 | 104 | 105 | 106 | 107 | 108 |
| 3-glycidoxypropyl-trimethoxysilane [g] | 1.38 | 1.38 | 1.38 | 1.38 | 1.38 | 1.40 | 1.39 | 1.38 |
| Zonyl ® FSO100 [g] | 0.69 | 0.69 | 0.69 | 0.69 | 0.69 | 0.70 | 0.70 | 0.69 |
| Ethanol [g] | 5.52 | 5.52 | 5.52 | 5.52 | 5.52 | 5.61 | 5.57 | 5.53 |
| PEDOT paste 02 lot F [g] | 250 | 250 | 250 | 250 | 250 | 253.99 | 252.46 | 250.66 |
| viscosity at 25° C. at shear rate of 0.2 s$^{-1}$ after 1 min [Pas] | — | 31.93 | 31.93 | 31.80 | 28.12 | 31.93 | 28.61 | 19.10 |
| viscosity at 25° C. at shear rate of 0.2 s$^{-1}$ after 10 min [Pas] | 31.93 | 30.70 | 30.21 | 30.58 | 27.68 | 29.96 | 29.10 | 29.35 |

The compositions of INVENTION EXAMPLES 101 to 108 were screen-printed at 300 mm/s with a 79 mesh on support 02, then dried for 10 minutes at 90° C. before curing by passing once through an AKTIPRINT T UV table dryer from Technigraf GmbH at a throughput of 20 m/min at 100% UV lamp power.

The optical densities of the prints together with the support, the surface resistances, haze values and homogeneity assessment values determined as described for INVENTION EXAMPLES 25 and 34 to 43 are given in Table 29 below for screen-printed prints obtained with the compositions of INVENTION EXAMPLES 101 to 105. The haze values for screen-printed prints obtained with the compositions of INVENTION EXAMPLES 106 to 108 are also given in Table 29.

TABLE 29

| | Invention Example nr | | | | | | | |
|---|---|---|---|---|---|---|---|---|
| | 101 | 102 | 103 | 104 | 105 | 106 | 107 | 108 |
| mesh | P79 | P79 | P79 | P79 | P79 | P79 | P79 | P79 |
| Surface resistance [Ω/square] | 844 | 783 | 730 | 750 | 726 | — | — | — |
| Optical density | 0.096 | 0.086 | 0.086 | 0.091 | 0.091 | — | — | — |
| Haze | 13.60 | 6.49 | 6.14 | 8.39 | 8.78 | 8.02 | 8.53 | 6.83 |
| Homogeneity assessment | 0.5 | 0 | 0 | 0 | 0 | — | — | — |
| Σ moles monomer × functionality | 0.0384 | 0.0598 | 0.0628 | 0.1067 | 0.1097 | — | — | — |

The compositions of INVENTION EXAMPLES 101 to 105 all hardened after drying at 90° C. for 10 minutes in a single pass through the AKTIPRINT T UV table dryer and exhibited excellent adhesion to support 02 despite the vinyl units available for polymerization being a factor of 1.55 to 2.86 higher for the compositions of INVENTION EXAMPLES 102 to 105 than for the standard composition of INVENTION EXAMPLE 101. Moreover, compared with the standard composition of INVENTION EXAMPLE 101 the prints produced with compositions of INVENTION EXAMPLES 102 to 108 all exhibited significantly reduced haze the compositions and the prints produced with compositions of 102 to 105 exhibited improved homogeneity assessment values.

Comparative Example 13

The composition of COMPARATIVE EXAMPLE 13 was prepared from a 1.1% by weight aqueous dispersion of PEDOT/PSS comprising a weight ratio PEDOT to PSS of 1:2.4 prepared in the substantial absence of oxygen as disclosed in WO 03/048227A1 by adding with stirring 26.502 g of diethylene glycol and 56.0 g of deionized water to 167.5 g of the 1.1% by weight PEDOT/PSS aqueous dispersion. To this dispersion was further added with stirring at 3000 rpm at 40° C. in sequence: 3-glycidyloxypropyl-trimethoxysilane, Zonyl® FSO100, ethanol, MONOMER 06, MONOMER 07, Initiator 52 and finally further deionized water to produce the composition of COMPARATIVE EXAMPLE 13. The viscosity at 25° C. of the resulting screen printing ink was too low to be determined using a Brookfield DVII+PRO cone and plate viscometer at a shear rate of 0.1 s$^{-1}$. The composition of the composition of COMPARATIVE EXAMPLE 13 is given in Table 30 below:

TABLE 30

| | Comparative Example nr. 13 |
|---|---|
| 1.1 wt % PEDOT/PSS aqueous dispersion [g] | 167.5 |
| diethylene glycol [g] | 26.502 |
| deionized water [g] | 56.00 |
| 3-glycidyloxypropyltrimethoxysilane [g] | 1.48 |
| Zonyl ® FSO100 [g] | 0.74 |
| ethanol [g] | 5.93 |
| INITIATOR 52 [g] | 0.994 |
| MONOMER 6 [g] | 9.6065 |
| MONOMER 7 [g] | 1.0674 |
| Initiator 52 [g] | 1.0674 |
| deionized water [g] | 8.00 |

The solids concentration of the composition of COMPARATIVE EXAMPLE 13 was too low to be screen-printed. Layers were coated on support 02 with a Braive coater with coating bars of 12 µm, 24 µm and 40 µm and were dried for 3 minutes at 130° C. before curing by passing twice through an AKTIPRINT T UV table dryer from Technigraf GmbH at a throughput of 20 m/min at 100% UV lamp power.

The optical densities of the prints together with the support, the surface resistances and haze values and determined as described for INVENTION EXAMPLES 25 and 34 to 43 are given in Table 31 below for screen-printed prints obtained with the compositions of COMPARATIVE EXAMPLE 13.

TABLE 31

| | Wet thickness [μm] | | |
|---|---|---|---|
| | 40 | 24 | 12 |
| Surface resistance [Ω/square] | 446, 378, 348 | 586, 1379, 931, 1271 | 5210, 5870 |
| Optical density | 0.083 | 0.065 | 0.065 |
| Haze | 14.5, 15.1, 6.9 | 10.6, 8.2, 9.4, 14.3 | 3.1, 4.0 |

Even with doctor blade-coated layers considerable variation in haze and surface resistance were observed, particularly for wet-layer thicknesses of 24 μm and 40 μm. Furthermore, it was not possible to screen print thick layers with the composition of COMPARATIVE EXAMPLE 13, because this results in prohibitively high haze due to inhomogenieties in the layer, although the surface resistances and optical densities are sufficiently low.

Comparative Example 14

The composition of COMPARATIVE EXAMPLE 14 was prepared by adding in sequence MONOMER 06, MONOMER 07 and INITIATOR 52 to PEDOT paste 03 with stirring at 3000 rpm and then stirring for a further 60 minutes to produce the composition of COMPARATIVE EXAMPLE 14. The viscosity of the resulting screen printing ink was determined at 25° C. using a Brookfield DVII+PRO cone and plate viscometer at a shear rate of 0.1 s$^{-1}$. The composition and viscosity of the composition of COMPARATIVE EXAMPLE 14 are given in Table 32 below:

TABLE 32

| | Comparative Example nr. 14 |
|---|---|
| INITIATOR 52 [g] | 0.994 |
| MONOMER 6 [g] | 8.948 g |
| MONOMER 7 [g] | 0.994 |
| PEDOT paste 03 [g] | 300 |
| viscosity at 25° C. at a shear rate of 0.1 s$^{-1}$ [mPas] | 73190 |

The composition of COMPARATIVE EXAMPLE 14 was screen-printed at 300 mm/s with a 79 mesh on support 02, then dried for 3 minutes at 130° C. before curing by passing once through an AKTIPRINT T UV table dryer from Technigraf GmbH at a throughput of 20 m/min at 100% UV lamp power.

The optical densities of the prints together with the support, the surface resistances and haze values and determined as described for INVENTION EXAMPLES 25 and 34 to 43 are given in Table 33 below for screen-printed prints obtained with the compositions of COMPARATIVE EXAMPLE 14.

TABLE 33

| | Comparative Example nr 14 |
|---|---|
| mesh | P79 |
| Surface resistance [Ω/square] | 6620 |
| Optical density | — |
| Haze | 31.9 |

The viscosity was suitable for screen printing. However, the surface resistance was very high and the haze was prohibitively high. In addition to the high haze, the layers were cracked and hazy, rendering such compositions prohibitive for screen printing.

Invention Examples 109 to 113

The compositions used in producing the compositions of INVENTION EXAMPLES 34 to 43 was prepared using PEDOT paste 02 as follows with the quantities given in Table 34 below: the 3-glycidoxy-propyltrimethoxy-silane was added to PEDOT paste 02 while stirring at 1000 rpm, then after waiting 5 minutes with stirring the Zonyl®FSO100 was added with stirring, then after waiting 60 minutes the ethanol was added slowly with stirring, a further 5 minutes was waited with stirring before adding a premixed mixture of INITIATOR 52 and MONOMERS 6 and 7 with stirring for 60 minutes to produce the final composition. The viscosities of the resulting screen printing ink were determined at 25° C. using a Brookfield DVII+PRO cone and plate viscometer at a shear rate of 0.2 s$^{-1}$ after 1 and 10 minutes. The composition and viscosity are given in Table 34 below:

TABLE 34

| INITIATOR 52 [g] | 3.96 |
|---|---|
| MONOMER 6 [g] | 35.64 |
| MONOMER 7 [g] | 3.96 |
| 3-glycidoxypropyltrimethoxysilane [g] | 5.01 |
| Zonyl ® FSO100 [g] | 2.50 |
| Ethanol [g] | 20.05 |
| PEDOT paste 02 [g] | 934 |
| viscosity at 25° C. & shear rate of 0.2 s$^{-1}$ after 1 min [mPas] | 28612 |
| viscosity at 25° C. & shear rate of 0.2 s$^{-1}$ after 10 min [mPas] | 25420 |

The prints of INVENTION EXAMPLES 109 to 113 were produced by screen-printing the composition given in Table 34 at 300 mm/s with a B79 mesh on supports 02, support 04, support 05, support 06 and support 07 then dried for 10 minutes at 90° C. before curing by passing 3 times through an AKTIPRINT T UV table dryer from Technigraf GmbH at a throughput of 20 m/min at 100% UV lamp power.

The optical densities of the prints together with the support and the surface resistances thereof were determined for the prints of INVENTION EXAMPLES 109 to 113 as described for the evaluation of the compositions of INVENTION EXAMPLES 25 and 34 to 43 and are given in Table 35.

The adhesion was determined with a tape test consisting of sticking and unsticking five times with TESA 4122 tape from BEIERSDORF with 0 representing excellent adhesion to 5 representing no adhesion.

The water resistance was determined by rubbing five times over the layer or print with a pad moistened with water with 0 representing no visible or measurable effect upon the layer i.e. excellent water resistance and 5 representing removal of the layer or print.

TABLE 35

| | Invention Example nr | | | | |
|---|---|---|---|---|---|
| | 109 | 110 | 111 | 112 | 113 |
| mesh | P79 | P79 | P79 | P79 | P79 |
| support | 02 | 04 | 05 | 06 | 07 |
| Surface resistance [kΩ/square] | 1.714 | 1.667 | 1.256 | 1.050 | 1.089 |
| Optical density | 0.09 | 0.08 | 0.09 | 0.08 | 0.09 |
| Water resistance | | 0 | 0 | 0 | 0 |
| Adhesion | 0 | 0 | 0 | 0 | 0 |

The wet and dry adhesion was good on all five supports as was the water resistance. The optical density was low. The surface resistance was lower on supports 06 and 07, the polycarbonate supports.

The present invention may include any feature or combination of features disclosed herein either implicitly or explicitly or any generalisation thereof. In view of the foregoing description it will be evident to a person skilled in the art that various modifications may be made within the scope of the invention.

Having described in detail preferred embodiments of the current invention, it will now be apparent to those skilled in the art that numerous modifications can be made therein without departing from the scope of the invention as defined in the following claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

We claim:

1. A composition comprising a solution or dispersion of a polyanion and more than 0.1% by weight of a polymer or copolymer of a substituted or unsubstituted thiophene, at least one compound with at least two (meth)acrylate groups, at least one further (meth)acrylate-compound with only one (meth)acrylate group which is capable of copolymerizing with the at least one compound with at least two (meth) acrylate groups, and at least one ultraviolet (UV)-photoinitiator in a liquid medium that comprises at least one non-aqueous solvent and has less than 30% by weight of water; and wherein said composition is capable of UV-photopolymerization.

2. The composition according to claim 1, wherein said liquid medium comprises less than 10% by weight of water.

3. The composition according to claim 1, said composition further comprising a polyhydroxy-organic compound and/or an aprotic compound with a dielectric constant greater than 15.

4. The composition according to claim 1, wherein said polymer or copolymer of a substituted thiophene is a polymer or copolymer of a 3,4-dialkoxythiophene in which said two alkoxy groups may be the same or different or together represent an optionally substituted oxy-alkylene-oxy bridge.

5. The composition according to claim 4, wherein said polymer or copolymer of a (3,4-dialkoxythiophene) is selected from the group consisting of: poly(3,4-methylenedioxythiophene), poly(3,4-methylenedioxythiophene) derivatives, poly(3,4-ethylenedioxythiophene), poly(3,4-ethylenedioxythiophene) derivatives, poly[3,4-(propylenedioxy)thiophene], poly[3,4-(propylenedioxy)thiophene] derivatives, poly(3,4-butylenedioxythiophene), poly(3,4-butylenedioxythiophene) derivatives and copolymers therewith.

6. The composition according to any one of claims 1 to 3 or 4 to 5, wherein said composition is an ink or paste.

7. The composition of claim 1, wherein the at least one further (meth)acrylate-compound with only one (meth)acrylate group is selected from the group consisting of 2-(2-ethoxy-ethoxy)-ethyl acrylate (EOEOEA), N-(2-methacryloyl-oxyethyl)-ethylene urea, tetrahydrofurfuryl acrylate (THFA), methoxy PEG 350 monomethacrylate, and polypropylene glycol monomethacrylate.

8. A process for preparing a composition comprising a solution or dispersion of a polyanion and more than 0.1% by weight of a polymer or copolymer of a substituted or unsubstituted thiophene, at least one compound with at least two (meth)acrylate groups, at least one further (meth)acrylate-compound with only one (meth)acrylate group which is capable of copolymerizing with the at least one compound with at least two (meth)acrylate groups, and at least one ultraviolet (UV)-photoinitiator in a liquid medium that comprises at least one non-aqueous solvent and has less than 30% by weight of water; said process comprising the steps of: providing a dispersion or solution of a polyanion and a polymer or copolymer of a substituted or unsubstituted thiophene in a polyhydroxy-solvent-containing liquid medium comprising at least 70% by weight of organic solvents, the balance being water; adding at least one compound with at least two (meth)acrylate groups, at least one further (meth)acrylate-compound with only one (meth)acrylate group which is capable of copolymerizing with the at least one compound with at least two (meth)acrylate groups, and at least one UV-photoinitiator; and mixing the resulting mixture, and the amount of the polymer or copolymer of a substituted or unsubstituted thiophene is in an amount to provide more than 0.1% by weight of the composition.

9. The process according to claim 8, wherein the mixing of the ingredients is performed at a temperature of 35° C. or lower.

10. The process according to claim 8, wherein at least one UV-photoinitiator is added as a solution or dispersion in at least one compound with at least two (meth)acrylate groups.

11. A process for producing a layer or pattern on an object comprising the steps of: (i) applying to said object a layer or pattern with a composition according to claim 1; (ii) optionally drying said layer or pattern; (iii) optionally heating said layer or pattern to reduce the surface resistance thereof; and (iii) curing said layer or pattern by exposing to UV-light, wherein steps (ii) and (iii) can be combined in a heating step during which the surface resistance of the layer or pattern is increased and said layer or pattern is dried.

12. The process according to claim 11, wherein said layer or pattern is substantially transparent.

13. The process according to claim 11, wherein the method comprises applying said composition by a printing process.

14. The process according to claim 13, wherein said printing process is selected from the group consisting of: screen printing, flexographic printing, stamp printing, gravure printing, tampon printing, lithographic printing and offset printing.

* * * * *